US008873011B2

United States Patent
Yamazaki et al.

(10) Patent No.: US 8,873,011 B2
(45) Date of Patent: Oct. 28, 2014

(54) LIQUID CRYSTAL DISPLAY DEVICE AND METHOD OF MANUFACTURING THE SAME

(71) Applicant: Semiconductor Energy Laboratory Co., Ltd., Atsugi (JP)

(72) Inventors: Shunpei Yamazaki, Setagaya (JP); Yoshiharu Hirakata, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/104,284

(22) Filed: Dec. 12, 2013

(65) Prior Publication Data

US 2014/0098321 A1  Apr. 10, 2014

Related U.S. Application Data

(60) Continuation of application No. 13/553,031, filed on Jul. 19, 2012, now Pat. No. 8,610,861, which is a continuation of application No. 13/191,962, filed on Jul. 27, 2011, now Pat. No. 8,228,477, which is a division of application No. 12/690,431, filed on Jan. 20, 2010, now Pat. No. 7,990,508, which is a continuation of application No. 11/511,440, filed on Aug. 29, 2006, now Pat. No. 7,656,491, which is a division of application No. 09/566,729, filed on May 9, 2000, now Pat. No. 7,102,718.

(30) Foreign Application Priority Data

Mar. 16, 2000 (JP) .................................. 2000-073577

(51) Int. Cl.
G02F 1/1343 (2006.01)
G02F 1/1362 (2006.01)
G02F 1/139 (2006.01)
H01L 27/12 (2006.01)
G02F 1/1345 (2006.01)
G02F 1/1368 (2006.01)

(52) U.S. Cl.
CPC ........ *G02F 1/1396* (2013.01); *G02F 1/136286* (2013.01); *G02F 2001/136231* (2013.01); *H01L 27/1214* (2013.01); *G02F 1/134363* (2013.01); *G02F 1/13458* (2013.01); *G02F 1/1368* (2013.01); *H01L 27/12* (2013.01); *G02F 1/13452* (2013.01)
USPC .......................................................... 349/141

(58) Field of Classification Search
USPC .......................................................... 349/141
See application file for complete search history.

(56) References Cited

U.S. PATENT DOCUMENTS 3,967,981 A  7/1976  Yamazaki
4,458,987 A  7/1984  Sasaki et al.
(Continued)

FOREIGN PATENT DOCUMENTS

EP  0 557 110  8/1993
EP  0 629 003  12/1994
(Continued)

OTHER PUBLICATIONS

Specification, claims, abstract, and drawings of U.S. Appl. No. 09/635,945 filed Aug. 10, 2000.

(Continued)

*Primary Examiner* — Timothy L Rude
(74) *Attorney, Agent, or Firm* — Eric J. Robinson; Robinson Intellectual Property Law Office, P.C.

(57) ABSTRACT

In a liquid crystal display device of an IPS system, to realize reduction of manufacturing cost and improvement of yield by decreasing the number of steps for manufacturing a TFT. A channel etch type bottom gate TFT structure, where patterning of a source region and a drain region and patterning of a source wiring and a pixel electrode are carried out by the same photomask.

15 Claims, 17 Drawing Sheets

(56) References Cited

U.S. PATENT DOCUMENTS

| | | |
|---|---|---|
| 4,624,737 A | 11/1986 | Shimbo |
| 4,730,903 A | 3/1988 | Yamazaki et al. |
| 4,914,503 A | 4/1990 | Shirato et al. |
| 4,960,719 A | 10/1990 | Tanaka et al. |
| 5,028,551 A | 7/1991 | Dohjo et al. |
| 5,084,961 A | 2/1992 | Yoshikawa |
| 5,151,806 A | 9/1992 | Kawamoto et al. |
| 5,181,132 A | 1/1993 | Shindo et al. |
| 5,231,039 A | 7/1993 | Sakono et al. |
| 5,261,156 A | 11/1993 | Mase et al. |
| 5,346,833 A | 9/1994 | Wu |
| 5,362,660 A | 11/1994 | Kwasnick et al. |
| 5,418,635 A | 5/1995 | Mitusi et al. |
| 5,428,250 A | 6/1995 | Ikeda et al. |
| 5,459,598 A | 10/1995 | Carrington |
| 5,466,617 A | 11/1995 | Shannon |
| 5,478,766 A | 12/1995 | Park et al. |
| 5,491,352 A | 2/1996 | Tsuji |
| 5,532,180 A | 7/1996 | den Boer et al. |
| 5,539,219 A | 7/1996 | den Boer et al. |
| 5,561,074 A | 10/1996 | Koide et al. |
| 5,561,440 A | 10/1996 | Kitajima et al. |
| 5,583,675 A | 12/1996 | Yamada et al. |
| 5,622,814 A | 4/1997 | Miyata et al. |
| 5,644,147 A | 7/1997 | Yamazaki et al. |
| 5,648,662 A | 7/1997 | Zhang et al. |
| 5,668,379 A | 9/1997 | Ono et al. |
| 5,668,651 A | 9/1997 | Yamada et al. |
| 5,684,318 A | 11/1997 | Ayres et al. |
| 5,706,064 A | 1/1998 | Fukunaga et al. |
| 5,710,612 A | 1/1998 | Mase |
| 5,729,312 A | 3/1998 | Yamagishi et al. |
| 5,734,177 A | 3/1998 | Sakamoto |
| 5,739,549 A | 4/1998 | Takemura et al. |
| 5,739,880 A | 4/1998 | Suzuki et al. |
| 5,739,882 A | 4/1998 | Shimizu et al. |
| 5,739,887 A | 4/1998 | Ueda et al. |
| 5,744,820 A | 4/1998 | Matsushima et al. |
| 5,757,453 A | 5/1998 | Shin et al. |
| 5,757,456 A | 5/1998 | Yamazaki et al. |
| 5,760,854 A | 6/1998 | Ono et al. |
| 5,766,977 A | 6/1998 | Yamazaki |
| 5,780,872 A | 7/1998 | Misawa et al. |
| 5,793,072 A | 8/1998 | Kuo |
| 5,798,812 A | 8/1998 | Nishiki et al. |
| 5,804,501 A | 9/1998 | Kim |
| 5,811,318 A | 9/1998 | Kweon |
| 5,811,328 A | 9/1998 | Zhang et al. |
| 5,811,835 A | 9/1998 | Seiki et al. |
| 5,811,846 A | 9/1998 | Miura et al. |
| 5,818,070 A | 10/1998 | Yamazaki et al. |
| 5,821,138 A | 10/1998 | Yamazaki et al. |
| 5,821,622 A | 10/1998 | Tsuji et al. |
| 5,825,449 A | 10/1998 | Shin |
| 5,828,433 A | 10/1998 | Shin |
| 5,830,785 A | 11/1998 | Sanson et al. |
| 5,831,710 A | 11/1998 | Colgan et al. |
| 5,834,327 A | 11/1998 | Yamazaki et al. |
| 5,838,400 A | 11/1998 | Ueda et al. |
| 5,844,643 A | 12/1998 | Onishi et al. |
| 5,847,687 A | 12/1998 | Hirakata et al. |
| 5,849,601 A | 12/1998 | Yamazaki |
| 5,852,487 A | 12/1998 | Fujimori et al. |
| 5,867,233 A | 2/1999 | Tanaka |
| 5,872,611 A | 2/1999 | Hirata et al. |
| 5,874,326 A | 2/1999 | Lyu |
| 5,880,794 A | 3/1999 | Hwang |
| 5,888,855 A | 3/1999 | Nagahisa et al. |
| 5,889,291 A | 3/1999 | Koyama et al. |
| 5,892,562 A | 4/1999 | Yamazaki et al. |
| 5,899,547 A | 5/1999 | Yamazaki et al. |
| 5,903,326 A | 5/1999 | Lee |
| 5,907,380 A | 5/1999 | Lien |
| 5,917,564 A | 6/1999 | Kim et al. |
| 5,917,567 A | 6/1999 | Oh et al. |
| 5,940,154 A | 8/1999 | Ukita et al. |
| 5,942,767 A | 8/1999 | Na et al. |
| 5,943,559 A | 8/1999 | Maeda |
| 5,953,093 A | 9/1999 | Hirata et al. |
| 5,959,599 A | 9/1999 | Hirakata |
| 5,966,189 A | 10/1999 | Matsuo |
| 5,968,850 A | 10/1999 | Jeong et al. |
| 5,977,562 A | 11/1999 | Hirakata et al. |
| 5,986,724 A | 11/1999 | Akiyama et al. |
| 5,990,998 A | 11/1999 | Park et al. |
| 5,994,721 A | 11/1999 | Zhong et al. |
| 5,995,190 A | 11/1999 | Nagae et al. |
| 5,998,229 A | 12/1999 | Lyu et al. |
| 5,998,230 A | 12/1999 | Gee-Sung et al. |
| 6,008,065 A | 12/1999 | Lee et al. |
| 6,008,869 A | 12/1999 | Oana et al. |
| 6,020,598 A | 2/2000 | Yamazaki |
| 6,025,216 A | 2/2000 | Ha |
| 6,025,891 A | 2/2000 | Kim |
| 6,025,892 A | 2/2000 | Kawai et al. |
| 6,037,017 A | 3/2000 | Kashiro |
| 6,038,003 A | 3/2000 | Kim |
| 6,054,975 A | 4/2000 | Kurokawa et al. |
| 6,055,028 A | 4/2000 | Nishi et al. |
| 6,061,112 A | 5/2000 | Ukita et al. |
| 6,064,358 A | 5/2000 | Kitajima et al. |
| 6,064,456 A | 5/2000 | Taniguchi et al. |
| 6,067,141 A | 5/2000 | Yamada et al. |
| 6,072,556 A | 6/2000 | Hirakata et al. |
| 6,072,557 A | 6/2000 | Kishimoto |
| 6,075,257 A | 6/2000 | Song |
| 6,097,458 A | 8/2000 | Tsuda et al. |
| 6,097,459 A | 8/2000 | Shimada et al. |
| 6,097,465 A | 8/2000 | Hiroki et al. |
| 6,114,184 A | 9/2000 | Matsumoto et al. |
| 6,118,502 A | 9/2000 | Yamazaki et al. |
| 6,124,155 A | 9/2000 | Zhang et al. |
| 6,124,604 A | 9/2000 | Koyama et al. |
| 6,124,606 A | 9/2000 | den Boer et al. |
| 6,130,443 A | 10/2000 | Hong et al. |
| 6,130,729 A | 10/2000 | Oh et al. |
| 6,133,977 A | 10/2000 | Lee et al. |
| 6,140,158 A | 10/2000 | Rhee et al. |
| 6,141,077 A | 10/2000 | Hirata et al. |
| 6,153,893 A | 11/2000 | Inoue et al. |
| 6,160,600 A | 12/2000 | Yamazaki et al. |
| 6,166,396 A | 12/2000 | Yamazaki |
| 6,166,399 A | 12/2000 | Zhang et al. |
| 6,172,728 B1 | 1/2001 | Hiraishi |
| 6,177,968 B1 | 1/2001 | Okada et al. |
| 6,184,946 B1 | 2/2001 | Ando et al. |
| 6,188,452 B1 | 2/2001 | Kim et al. |
| 6,190,933 B1 | 2/2001 | Shimabukuro et al. |
| 6,197,625 B1 | 3/2001 | Choi |
| 6,198,133 B1 | 3/2001 | Yamazaki et al. |
| 6,208,390 B1 | 3/2001 | Ejiri et al. |
| 6,208,395 B1 | 3/2001 | Kanoh et al. |
| 6,215,541 B1 | 4/2001 | Song et al. |
| 6,218,219 B1 | 4/2001 | Yamazaki et al. |
| 6,218,221 B1 | 4/2001 | Sah |
| 6,222,603 B1 | 4/2001 | Sakai et al. |
| 6,235,561 B1 | 5/2001 | Seiki et al. |
| 6,239,854 B1 | 5/2001 | Hirakata et al. |
| 6,243,064 B1 | 6/2001 | Hirakata |
| 6,255,668 B1 | 7/2001 | Kang et al. |
| 6,265,889 B1 | 7/2001 | Tomita et al. |
| 6,266,117 B1 | 7/2001 | Yanagawa et al. |
| 6,266,121 B1 | 7/2001 | Shigeta et al. |
| 6,266,122 B1 | 7/2001 | Kishimoto et al. |
| 6,268,617 B1 | 7/2001 | Hirakata et al. |
| 6,271,903 B1 | 8/2001 | Shin et al. |
| 6,287,899 B1 | 9/2001 | Park et al. |
| 6,297,519 B1 | 10/2001 | Fujikawa et al. |
| 6,300,926 B1 | 10/2001 | Yoneya et al. |
| 6,304,243 B1 | 10/2001 | Kondo et al. |
| 6,304,305 B1 | 10/2001 | Matsumoto et al. |
| 6,317,185 B1 | 11/2001 | Harano et al. |
| 6,317,187 B1 | 11/2001 | Nakajima et al. |
| 6,323,051 B1 | 11/2001 | Shimada |

(56) References Cited

U.S. PATENT DOCUMENTS

| | | |
|---|---|---|
| 6,330,049 B1 | 12/2001 | Kume et al. |
| 6,331,845 B1 | 12/2001 | Kitajima et al. |
| 6,331,881 B1 | 12/2001 | Hatano et al. |
| 6,335,213 B1 | 1/2002 | Zhang et al. |
| 6,335,778 B1 | 1/2002 | Kubota et al. |
| 6,339,462 B1 | 1/2002 | Kishimoto et al. |
| 6,341,002 B1 | 1/2002 | Shimizu et al. |
| 6,342,939 B1 | 1/2002 | Hirata et al. |
| 6,344,888 B2 | 2/2002 | Yasukawa |
| 6,359,672 B2 | 3/2002 | Gu et al. |
| 6,362,866 B1 | 3/2002 | Yamazaki et al. |
| 6,365,933 B1 | 4/2002 | Yamazaki et al. |
| 6,368,485 B1 | 4/2002 | Ue et al. |
| 6,384,818 B1 | 5/2002 | Yamazaki et al. |
| 6,387,737 B1 | 5/2002 | Yamazaki et al. |
| 6,407,431 B2 | 6/2002 | Yamazaki et al. |
| 6,411,358 B2 | 6/2002 | Song et al. |
| 6,429,057 B1 | 8/2002 | Hong et al. |
| 6,433,842 B1 | 8/2002 | Kaneko et al. |
| 6,437,844 B1 | 8/2002 | Hattori et al. |
| 6,441,399 B1 | 8/2002 | Koyama et al. |
| 6,456,269 B2 | 9/2002 | Hirakata |
| 6,462,802 B1 | 10/2002 | Nishimura et al. |
| 6,465,268 B2 | 10/2002 | Hirakata et al. |
| 6,466,289 B1 | 10/2002 | Lee et al. |
| 6,493,050 B1 | 12/2002 | Lien et al. |
| 6,498,634 B1 | 12/2002 | Yamazaki et al. |
| 6,519,018 B1 | 2/2003 | Samant et al. |
| 6,528,357 B2 | 3/2003 | Dojo et al. |
| 6,529,256 B1 | 3/2003 | Seo |
| 6,531,392 B2 | 3/2003 | Song et al. |
| 6,567,146 B2 | 5/2003 | Hirakata et al. |
| 6,573,564 B2 | 6/2003 | Yamazaki et al. |
| 6,583,065 B1 | 6/2003 | Williams et al. |
| 6,587,162 B1 | 7/2003 | Kaneko et al. |
| 6,599,791 B1 | 7/2003 | Koyama et al. |
| 6,611,309 B2 | 8/2003 | Park et al. |
| 6,617,644 B1 | 9/2003 | Yamazaki et al. |
| 6,617,648 B1 | 9/2003 | Yamazaki et al. |
| 6,621,102 B2 | 9/2003 | Hirakata et al. |
| 6,624,864 B1 | 9/2003 | Kubo et al. |
| 6,630,977 B1 | 10/2003 | Yamazaki et al. |
| 6,642,074 B2 | 11/2003 | Hong et al. |
| 6,661,488 B1 | 12/2003 | Takeda et al. |
| 6,671,025 B1 | 12/2003 | Ikeda et al. |
| 6,697,129 B1 | 2/2004 | Nishi et al. |
| 6,709,901 B1 | 3/2004 | Yamazaki et al. |
| 6,743,650 B2 | 6/2004 | Hirakata et al. |
| 6,747,288 B2 | 6/2004 | Yamazaki et al. |
| 6,756,258 B2 | 6/2004 | Zhang et al. |
| 6,762,082 B2 | 7/2004 | Yamazaki et al. |
| 6,762,813 B1 | 7/2004 | Zhang et al. |
| 6,771,342 B1 | 8/2004 | Hirakata et al. |
| 6,774,974 B1 | 8/2004 | Matsuyama |
| 6,787,809 B2 | 9/2004 | Hong et al. |
| 6,797,548 B2 | 9/2004 | Zhang et al. |
| 6,806,495 B1 | 10/2004 | Yamazaki et al. |
| 6,806,499 B2 | 10/2004 | Yamazaki et al. |
| 6,806,937 B2 | 10/2004 | Park et al. |
| 6,847,064 B2 | 1/2005 | Zhang et al. |
| 6,855,957 B1 | 2/2005 | Yamazaki et al. |
| 6,856,360 B1 | 2/2005 | Higuchi et al. |
| 6,856,372 B2 | 2/2005 | Song et al. |
| 6,861,670 B1 | 3/2005 | Ohtani et al. |
| 6,873,312 B2 | 3/2005 | Matsueda |
| 6,900,084 B1 | 5/2005 | Yamazaki |
| 6,911,962 B1 | 6/2005 | Hirakata et al. |
| 6,914,655 B2 | 7/2005 | Yamazaki et al. |
| 6,950,168 B2 | 9/2005 | Yamazaki et al. |
| 7,016,003 B2 | 3/2006 | Hirakata et al. |
| 7,019,329 B2 | 3/2006 | Yamazaki et al. |
| 7,071,037 B2 | 7/2006 | Suzawa et al. |
| 7,078,255 B2 | 7/2006 | Hong et al. |
| 7,102,165 B2 | 9/2006 | Yamazaki |
| 7,102,718 B1 | 9/2006 | Yamazaki et al. |
| 7,145,173 B2 | 12/2006 | Koyama et al. |
| 7,166,862 B2 | 1/2007 | Koyama et al. |
| 7,202,497 B2 | 4/2007 | Ohtani et al. |
| 7,235,810 B1 | 6/2007 | Yamazaki et al. |
| 7,259,427 B2 | 8/2007 | Yamazaki et al. |
| 7,279,711 B1 | 10/2007 | Yamazaki et al. |
| 7,317,438 B2 | 1/2008 | Yamazaki et al. |
| 7,323,715 B2 | 1/2008 | Yamazaki |
| 7,403,238 B2 | 7/2008 | Higuchi et al. |
| 7,414,266 B2 | 8/2008 | Yamazaki et al. |
| 7,507,991 B2 | 3/2009 | Zhang et al. |
| 7,511,776 B2 | 3/2009 | Nishi et al. |
| 7,652,294 B2 | 1/2010 | Yamazaki et al. |
| 7,656,491 B2 | 2/2010 | Yamazaki et al. |
| 7,687,325 B2 | 3/2010 | Yamazaki et al. |
| 7,705,354 B2 | 4/2010 | Yamazaki et al. |
| 7,714,975 B1 | 5/2010 | Yamazaki et al. |
| 7,728,334 B2 | 6/2010 | Yamazaki et al. |
| 7,902,550 B2 | 3/2011 | Yamazaki |
| 7,923,779 B2 | 4/2011 | Yamazaki et al. |
| 7,961,263 B2 | 6/2011 | Song et al. |
| 7,973,312 B2 | 7/2011 | Yamazaki et al. |
| 7,978,292 B2 | 7/2011 | Park et al. |
| 2001/0045998 A1 | 11/2001 | Nagata et al. |
| 2004/0207789 A1 | 10/2004 | Hirakata et al. |
| 2004/0218112 A1 | 11/2004 | Hirakata et al. |
| 2005/0098894 A1 | 5/2005 | Ohtani et al. |
| 2006/0228821 A1 | 10/2006 | Hong et al. |
| 2007/0146568 A1 | 6/2007 | Yamazaki et al. |
| 2010/0195013 A1 | 8/2010 | Yamazaki et al. |

FOREIGN PATENT DOCUMENTS

| | | |
|---|---|---|
| EP | 0 678 907 | 10/1995 |
| EP | 1 001 467 | 5/2000 |
| EP | 1 006 589 | 6/2000 |
| EP | 1 041 622 | 10/2000 |
| JP | 62-131578 | 6/1987 |
| JP | 63-082405 | 4/1988 |
| JP | 01-210989 | 8/1989 |
| JP | 05-034717 | 2/1993 |
| JP | 05-119331 | 5/1993 |
| JP | 05-142558 | 6/1993 |
| JP | 05-175500 | 7/1993 |
| JP | 05-265020 | 10/1993 |
| JP | 05-323371 | 12/1993 |
| JP | 06-082754 | 3/1994 |
| JP | 06-148683 | 5/1994 |
| JP | 06-194615 | 7/1994 |
| JP | 06-250210 | 9/1994 |
| JP | 07-013196 | 1/1995 |
| JP | 07-014880 | 1/1995 |
| JP | 07-159776 | 6/1995 |
| JP | 07-191348 | 7/1995 |
| JP | 07-318975 | 12/1995 |
| JP | 08-087030 | 4/1996 |
| JP | 08-087033 | 4/1996 |
| JP | 09-005767 | 1/1997 |
| JP | 09-015621 | 1/1997 |
| JP | 09-054318 | 2/1997 |
| JP | 09-073101 | 3/1997 |
| JP | 09-074257 | 3/1997 |
| JP | 09-152626 | 6/1997 |
| JP | 09-153618 | 6/1997 |
| JP | 09-274444 | 10/1997 |
| JP | 10-048651 | 2/1998 |
| JP | 10-048663 | 2/1998 |
| JP | 10-123574 | 5/1998 |
| JP | 10-170959 | 6/1998 |
| JP | 11-024063 | 1/1999 |
| JP | 11-109372 | 4/1999 |
| JP | 11-133455 | 5/1999 |
| JP | 11-160732 | 6/1999 |
| JP | 11-202368 | 7/1999 |
| JP | 11-258596 | 9/1999 |
| JP | 11-258625 | 9/1999 |
| JP | 11-264998 | 9/1999 |
| JP | 11-337978 | 12/1999 |
| JP | 11-352322 | 12/1999 |

(56) References Cited

FOREIGN PATENT DOCUMENTS

| | | |
|---|---|---|
| JP | 2000-002886 | 1/2000 |
| JP | 2000-019543 | 1/2000 |
| JP | 2000-047240 | 2/2000 |
| JP | 2000-075302 | 3/2000 |
| JP | 2000-111901 | 4/2000 |
| JP | 2000-341242 | 12/2000 |
| JP | 2001-085698 | 3/2001 |
| KR | 1996-0000262 | 1/1996 |
| KR | 1997-024311 | 5/1997 |
| KR | 1998-072232 | 11/1998 |
| KR | 1998-083765 | 12/1998 |
| KR | 161466 | 1/1999 |
| KR | 1999-011210 | 2/1999 |
| KR | 1999-063319 | 7/1999 |
| KR | 1999-074563 | 10/1999 |
| KR | 1999-075407 | 10/1999 |
| KR | 1999-085237 | 12/1999 |
| KR | 10-0238510 | 1/2000 |
| KR | 2000-033515 | 6/2000 |
| KR | 2000-047013 | 7/2000 |
| KR | 2000-056867 | 9/2000 |
| KR | 10-0510439 | 10/2005 |
| XN | 11-160734 | 6/1999 |

OTHER PUBLICATIONS

Wolf et al., *Silicon Processing for the VLSI Era*, vol. 1: Process Technology, Lattice Press, pp. 161-175, 335, 1986.
Office Action (Application No. 10-2001-0013590) dated Jul. 10, 2007.
Office Action (Application No. 10-2006-0023808) dated Jul. 10, 2007.
Office Action (Application No. 10-2001-0013590) dated Jan. 24, 2008.
Office Action (Application No. 10-2008-0097181) dated Nov. 25, 2008.
Wolf et al., *Silicon Processing for the VLSI Era*, vol. 1: Process Technology, Lattice Press, pp. 359-365, 1986.

Fig. 9
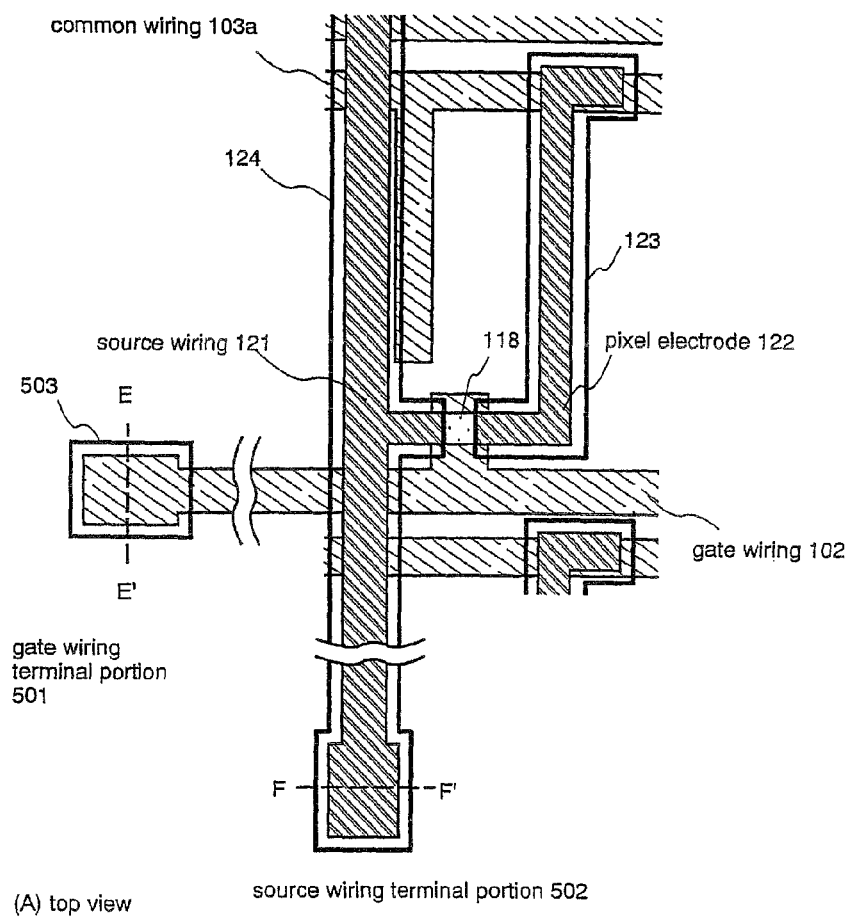
(A) top view
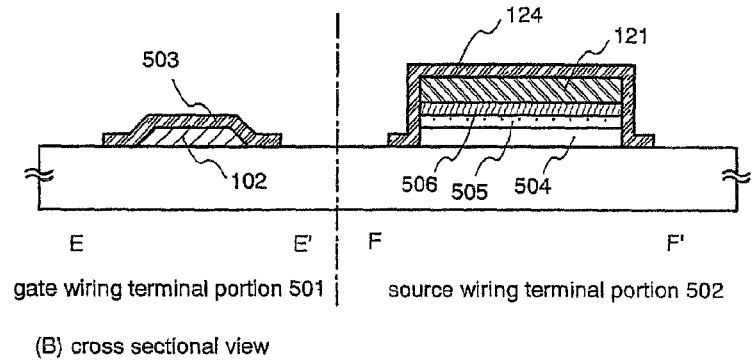
(B) cross sectional view

800: first substrate, 801: a region for attaching IC chip (data line),
802: a region for attaching IC chip (scanning line), 803: pixel region
804: input-output terminal, 805: connection wiring, 806,807: IC chip
808: second substrate, 810: sealing material, 811: liquid crystal,
812: FPC, 813: reinforcing plate Fig. 15
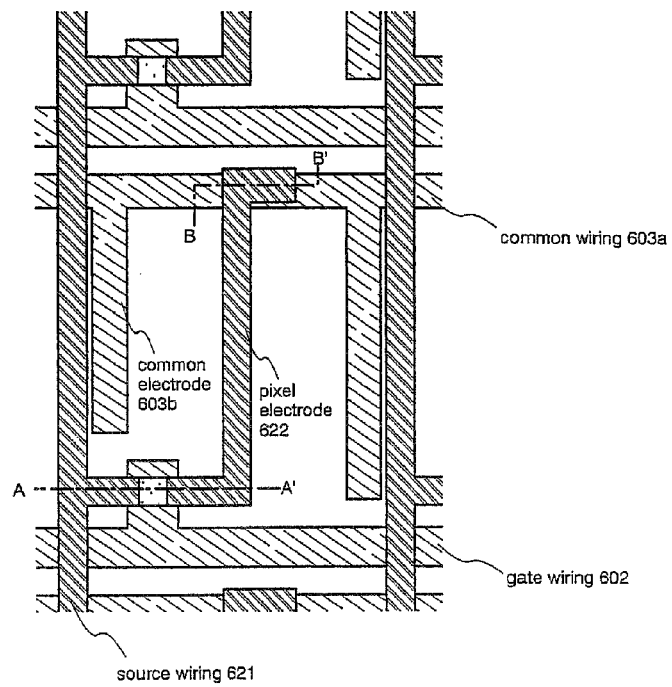
Fig. 16
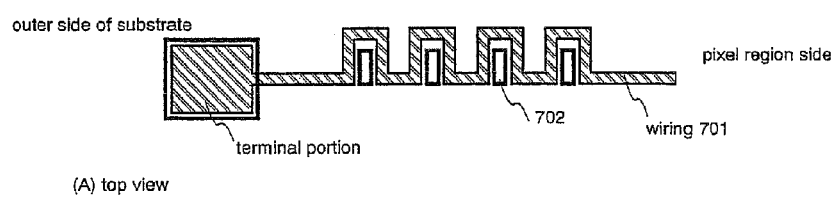
(A) top view
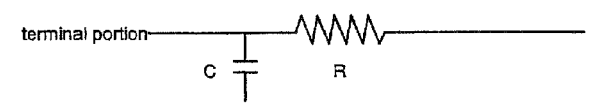
(B) circuit diagram

LIQUID CRYSTAL DISPLAY DEVICE AND METHOD OF MANUFACTURING THE SAME

BACKGROUND OF THE INVENTION

1. Field of the Invention

The present invention relates to an active matrix type liquid crystal display device, and particularly to an active matrix type liquid crystal display device of an IPS (In-Plane Switching) system (=transverse electric field system).

2. Description of Related Art

An active matrix type liquid crystal display device using an active element such as a thin film transistor (TFT) is known. The active matrix type liquid crystal display device can increase pixel density, is small and lightweight, and consumes less power, so that as a substitute for a CRT, a product such as a monitor of a personal computer or a liquid crystal television has been developed. Especially, a technique of forming an active layer of a TFT by a crystalline semiconductor film typified by polycrystalline silicon makes it possible to form a driver circuit as well as a switching TFT for a pixel portion (hereinafter referred to as a pixel TFT) on the same substrate, and is ranked as a technique to contribute to miniaturization and weight lightening of a liquid crystal display device.

In the liquid crystal display device, a liquid crystal is sealed between a pair of substrates, and liquid crystal molecules are oriented by an electric field which is applied between a pixel electrode (individual electrode) of one of the substrates and an opposite electrode (common electrode) of the other substrate and is approximately vertical to a substrate plane. However, such a driving method of a liquid crystal has a defect that an angle of view is narrow, that is, although a normal display state is obtained when it is viewed in a direction vertical to the substrate plane, a color tone is changed and becomes unclear when it is viewed in an oblique direction.

As a method of overcoming this defect, there is an IPS system. This system has a feature that both a pixel electrode and a common wiring are formed on one of substrates and an electric field is changed to a transverse direction, and liquid crystal molecules do not rise but their orientation is controlled in the direction almost parallel with a substrate plane. By this operation principle, the angle of view can be widened.

SUMMARY OF THE INVENTION

Problem to be Solved by the Invention

Usage of a liquid crystal display device has been widened, and also in the IPS system, with enlargement of a screen size, a demand for high fineness, high aperture ratio, and high reliability has increased. At the same time, a demand for improvement of productivity and reduction of cost has also increased.

In order to improve the productivity and to improve yield, the reduction in the number of steps is considered as an effective means.

Specifically, it is necessary to reduce the number of photomasks needed to produce the TFT. The photomask is used in a photolithography technique in order to form a photoresist pattern, which becomes an etching process mask, on the substrate.

By using one photomask, there are applied with steps such as applying resist, pre-baking, exposure, development, and post-baking, and steps of film deposition and etching before and after, and in addition, resist peeling, cleaning, and drying steps are added. Therefore, the entire process becomes complex, which leads to a problem.

Further, static electricity is generated by causes such as friction during manufacturing steps because the substrate is an insulator. If static electricity is generated, then short circuits develop at an intersection portion of wirings formed on the substrate, and deterioration or breakage of the TFT due to static electricity leads to display faults or deterioration of image quality in electro-optical devices. In particular, static electricity develops during rubbing in the liquid crystal orienting process performed in the manufacturing steps, and this becomes a problem.

The present invention is for answering these types of problems, and an object of the present invention is to reduce the number of steps for manufacturing a TFT, and to realize a reduction in the production cost and an improvement in a liquid crystal display device of an IPS system.

Further, an object of the present invention is to provide a structure and a method of manufacturing the structure for resolving the problems of damage to the TFT and deterioration of TFT characteristics due to static electricity.

Means for Solving the Problem

In order to solve the above problems, the present invention is characterized by employing a channel etch type bottom gate TFT structure, and by performing patterning of a source region, a drain region, and patterning of a source wiring, a pixel electrode by using the same photomask.

A method of manufacturing of the present invention is simply explained below.

First, a gate wiring 102 and a common wiring 103a (and a common electrode 103b) are formed using a first mask (photomask number 1).

Next, an insulating film (gate insulating film) 104a, a first amorphous semiconductor film 105, a second amorphous semiconductor film 106 containing an impurity element which imparts n-type conductivity, and a first conductive film 107 are laminated in order. (FIG. 2(A)) Note that a microcrystalline semiconductor film may be used as a substitute for the amorphous semiconductor film, and that a microcrystalline semiconductor film containing an impurity element which imparts n-type conductivity may be used as a substitute for the amorphous semiconductor film containing an impurity element which imparts n-type conductivity. In addition, these films (104a, 105, 106, and 107) can be formed in succession without exposure to the atmosphere in a plurality of chambers, or in the same chamber, using sputtering or plasma CVD. The mixing in of impurities can be prevented by having no exposure to the atmosphere.

Next, by using a second mask (photomask number 2): the above first conductive film 107 is patterned, forming a wiring (which later becomes a source wiring and a pixel electrode) 114 from the first conductive film; the above second amorphous semiconductor film 106 is patterned, forming a second amorphous semiconductor film 112 containing an impurity element which imparts n-type conductivity; and the above first amorphous semiconductor film 105 is patterned, forming a first amorphous semiconductor film 110. (FIG. 2(B))

Thereafter, a second conductive film 116 is formed on the entire surface (FIG. 2(D)). Note that as the second conductive film 116, a transparent conductive film may be used, or a conductive film having reflectivity may be used. This second conductive film is provided for prevention of electro-static damage, protection of a wiring, and electrical connection of a terminal portion.

Next, by using a third mask (photomask number 3): the above second conductive film 116 is patterned; the above wiring 114 is patterned, forming a source wiring 121 and a pixel electrode 122; the second amorphous semiconductor film 112 containing an impurity element which imparts n-type conductivity is patterned, forming a source region 119 and a drain region 120 from the second amorphous semiconductor film containing an impurity element which imparts n-type conductivity; and a portion of the above first amorphous semiconductor film 110 is removed, forming a first amorphous semiconductor film 118. (FIG. 3(A))

By using this type of constitution, the number of photomasks used in the photolithography technique can be set to 3 when manufacturing a pixel TFT portion.

A structure of the present invention disclosed in this specification is:

a liquid crystal display device including a pair of substrates and a liquid crystal held between the pair of substrates, wherein the liquid crystal display device is characterized in that the gate wiring 102 and the common electrode 103*b* is formed on one of the pair of substrates, the insulating film 104*b* is formed on the gate wiring 102 and the common electrode 103*b*, the amorphous semiconductor film 118 is formed on the insulating film, the source region 119 and the drain region 120 are formed on the amorphous semiconductor film, the source wiring 121 or the pixel electrode 122 is formed on the source region 119 or the drain region 120, the pixel electrode 122 and the common electrode 103*b* are disposed so that an electric field parallel with a substrate plane of the one substrate is generated, and one end face of the drain region 120 or the source region 119 is substantially coincident with an end face of the amorphous semiconductor film 118 and an end face of the pixel electrode 122.

Further, another structure of the present invention is:

a liquid crystal display device including a pair of substrates and a liquid crystal held between the pair of substrates, wherein the liquid crystal display device is characterized in that the gate wiring 102 and the common electrode 103*b* are formed on one of the pair of substrates, the insulating film 104*b* is formed on the gate wiring 102 and the common electrode 103*b*, the amorphous semiconductor film 118 is formed on the insulating film, the source region 119 and the drain region 120 are formed on the amorphous semiconductor film 118, the source wiring 121 or the pixel electrode 122 is formed on the source region 119 or the drain region 120, the pixel electrode 122 and the common electrode 103*b* are disposed so that an electric field parallel with a substrate plane of the one substrate is generated, and one end face of the drain region 120 or the source region 119 is substantially coincident with an end face of the amorphous semiconductor film 118 and an end face of the pixel electrode 122, and the other end face is substantially coincident with an end face of the source wiring 122.

Further, another structure of the present invention is:

a liquid crystal display device including a pair of substrates and a liquid crystal held between the pair of substrates, wherein the liquid crystal display device is characterized in that the gate wiring 102 and the common electrode 103*b* is formed on one of the pair of substrates, the insulating film is formed on the gate wiring 102 and the common electrode 103*b*, the amorphous semiconductor film 118 is formed on the insulating film, the source region 119 and the drain region 120 are formed on the amorphous semiconductor film, the source wiring 121 or the pixel electrode 122 is formed on the source region 119 or the drain region 120, the pixel electrode 122 and the common electrode 103*b* are disposed so that an electric field parallel with a substrate plane of the one substrate is generated, and the amorphous semiconductor film 118 and an amorphous semiconductor film containing an impurity element which imparts an n-type conductivity are laminated under the source wiring.

Further, in the above-mentioned respective structures, the liquid crystal display device is characterized in that the source region and the drain region is made from an amorphous semiconductor film containing an impurity element which imparts n-type conductivity.

Further, in the above-mentioned respective structures, the liquid crystal display device is characterized in that the gate wiring 102 is formed from a film of an element selected from the group consisting of Al, Cu, Ti, Mo, W, Ta, Nd, and Cr, from an alloy film of said elements, or from a lamination film of said elements.

Still further, in the above-mentioned respective structures, the liquid crystal display device is characterized in that the source region 119 and the drain region 120 are formed by using the same mask as that of the pixel electrode 122. Moreover, it is characterized in that the source region 119 and the drain region 120 are formed by using the same mask as that of the source wiring 121.

Yet further, in the above-mentioned respective structures, the liquid crystal display device is characterized in that in the amorphous semiconductor film, its thickness in a region where it is in contact with the source region and the drain region is thicker than its thickness in a region between the region where it is in contact with the source region and the region where it is in contact with the drain region.

Yet further, in the above-mentioned respective structures, the liquid crystal display device is characterized in the pixel electrode is covered with a transparent conductive film. Besides, it is characterized in that the source wiring and a terminal on an extension of the source wiring are covered with a transparent conductive film.

Further, a structure of the invention to attain the above-mentioned respective structures is a method of manufacturing a liquid crystal display device, characterized in that the method comprises:

a first step of forming the gate wiring 102 and the common electrode 103*b* (and the common wiring 103*a*) on an insulating surface by using a first mask;

a second step of forming the insulating film 104*a* covering said gate wiring 102 and said common electrode 103*b*;

a third step of forming the first amorphous semiconductor film 105 on said insulating film 104*a*;

a fourth step of forming the second amorphous semiconductor film 106, containing an impurity element which imparts n-type conductivity, on said first amorphous semiconductor film 105;

a fifth step of forming the first conductive film 107 on said second amorphous semiconductor film 106;

a sixth step of patterning said first amorphous semiconductor film 105 by using a second mask; of patterning said second amorphous semiconductor film 106 by using said second mask; of patterning said first conductive film 107 by using said second mask; and of forming the wiring 114 from said first conductive film; and an eighth step of patterning said wiring 114 by using said third mask, forming the source wiring 121 and the pixel electrode 122; of patterning said second amorphous semiconductor film 112 by using said third mask, forming the source region 119 and the drain region 120 made from said second amorphous semiconductor film; and of performing removal of a portion of said first amorphous semiconductor film by using said third mask.

Still further, another structure of the present invention to attain the above-mentioned respective structures is a method of manufacturing a liquid crystal display device characterized in that the method comprises:

a first step of forming the gate wiring 102 and the common electrode 103b (and the common wiring 103a) on the insulating surface by using a first mask;

a second step of forming the insulating film 104a covering said gate wiring 102 and said common electrode 103b;

a third step of forming the first amorphous semiconductor film 105 on said insulating film 104a;

a fourth step of forming the second amorphous semiconductor film 106, containing an impurity element which imparts n-type conductivity, on said first amorphous semiconductor film;

a fifth step of forming the first conductive film 107 on said second amorphous semiconductor film 106;

a sixth step of patterning said first amorphous semiconductor film 105 by using a second mask; of patterning said second amorphous semiconductor film 106 by using said second mask; of patterning said first conductive film 107 by using said second mask; and of forming the wiring 114 from said first conductive film;

a seventh step of forming the second conductive film 116 contacting and overlapping said wiring 114; and an eighth step of patterning said second conductive film 116 by using a third mask, forming an electrode made from said second conductive film; of patterning said wiring 114 by using said third mask, forming the source wiring 121 and the pixel electrode 122; of patterning said second amorphous semiconductor film 116 by using said third mask, forming the source region 119 and the drain region 120 made from said second amorphous semiconductor film; and of performing removal of a portion of said first amorphous semiconductor film by using said third mask.

In the above structure, it is characterized in that the second conductive film 116 is a transparent conductive film.

Further, in the above-mentioned respective structures, it is characterized in that the pixel electrode and the common electrode are disposed so that an electric field parallel with the insulating surface is generated.

Effect of the Invention

With the present invention, an electro-optical device of an IPS system prepared with a pixel TFT portion, having a reverse stagger type n-channel TFT, and a storage capacitor can be realized through three photolithography processes using three photomasks.

Further, when forming a protecting film, an electro-optical device of an IPS system prepared with a pixel TFT portion, having a reverse stagger type n-channel TFT protected by an inorganic insulating film, and a storage capacitor can be realized through four photolithography processes using four photomasks.

BRIEF DESCRIPTION OF THE DRAWINGS

FIGS. 9A-B are top views and a cross-sectional views of an input terminal portion.

FIG. 15 is a diagram showing a top view of the invention

FIGS. 16A-B are a top view and a circuit diagram of a protecting circuit.

DETAILED DESCRIPTION OF THE INVENTION

Embodiment modes of the present invention will be described below.

Figure 1:
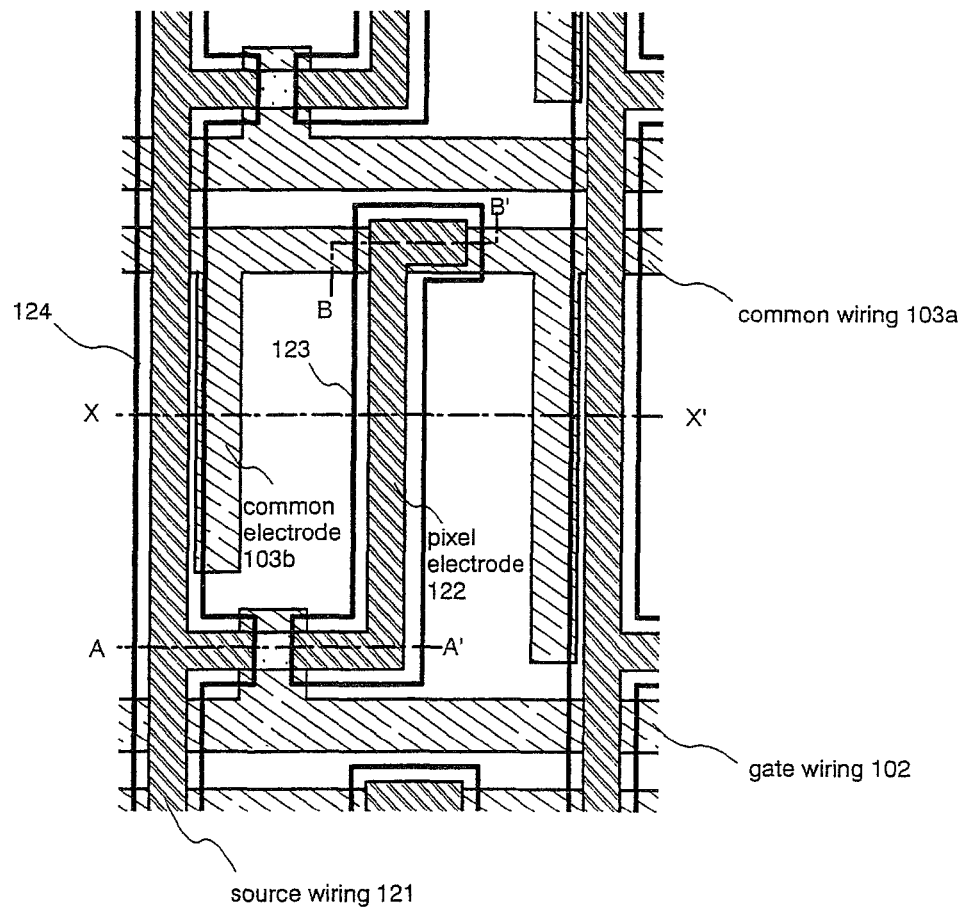
FIG. 1 is a diagram showing a top view of the present invention.
Figure 2:
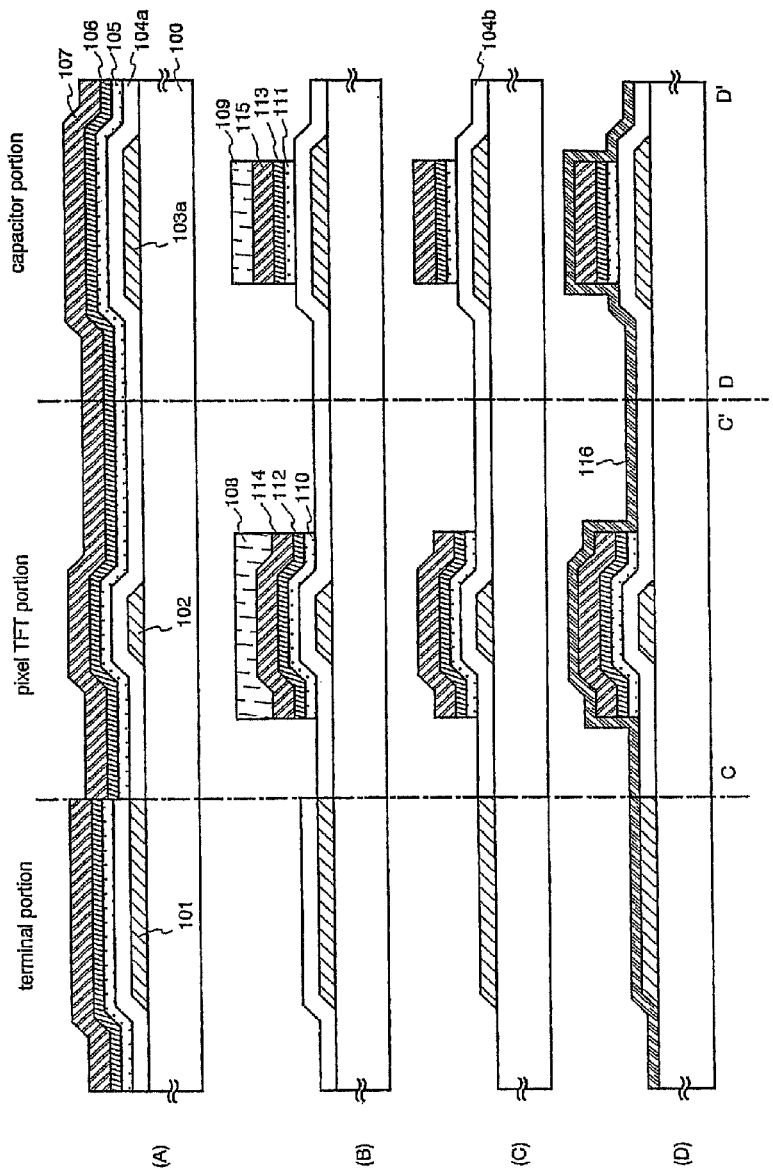
FIGS. 2A-D are cross-sectional views showing a process of manufacturing an active matrix substrate.
Figure 3:
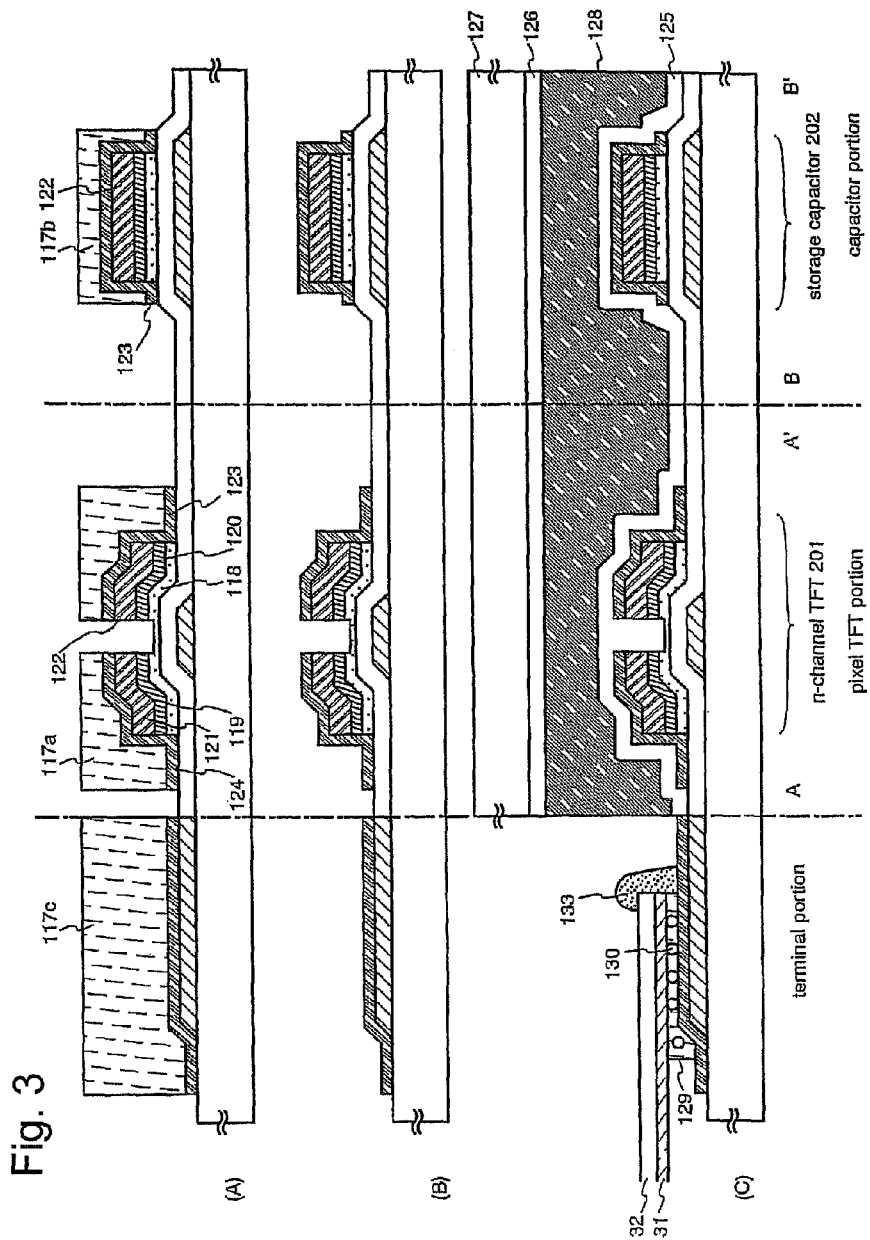
FIGS. 3A-C are cross-sectional views showing the process of manufacturing the active matrix substrate.

FIG. 1 is an example of a plan view showing a pixel structure of an IPS system in the present invention, and here, for simplification, one pixel structure in a plurality of pixels arranged in matrix form is shown. FIG. 2 and FIG. 3 are views showing manufacturing steps.

As shown in FIG. 1, this active matrix substrate includes a plurality of gate wirings arranged in parallel with each other and a plurality of source wirings perpendicular to the respective gate wirings. Besides, it includes a plurality of common wirings in the same layer as the gate wirings.

Besides, a pixel electrode 122 is disposed in a region surrounded by the gate wirings 102 and the source wirings 121. Besides, two common electrodes 103b parallel to each other are disposed at both sides of this pixel electrode 122. A liquid crystal is driven by using an electric field in a transverse direction formed between this pixel electrode 122 and the common electrodes 103b. Besides, in order to decrease a light leakage due to a gap between the common electrode and the source wiring, they may be disposed to partially overlap with each other.

Further, a TFT is formed in the vicinity of an intersection portion of the gate wirings 102 and the source wirings 121 as a switching element. This TFT is a reverse stagger type TFT (channel etch type) having a channel forming region formed from a semiconductor film possessing an amorphous structure (hereafter referred to as a first amorphous semiconductor film).

Further, the TFT is formed by a lamination of, in order on an insulating substrate, a gate electrode (formed integrally to the gate wiring 102), a gate insulating film, a first amorphous semiconductor film, a source region or a drain region made from a second amorphous semiconductor film, containing a impurity element which imparts n-type conductivity, a source electrode (formed as integrated with the source wirings 121) and a pixel electrode 122.

Further, the film thickness of a region between a region contacting the source region and a region contacting the drain region is thinner compared to other regions of the first amorphous semiconductor film. The reason that the film thickness becomes thin is that when forming the source region and the drain region by partitioning the second amorphous semiconductor film, which contains the impurity element for imparting n-type conductivity, by etching, a portion of the first amorphous semiconductor film is also removed. Further, an end surface of the pixel electrode, and an end surface of the drain region coincide by this etching process. This type of reverse stagger type TFT is referred to as a channel etched type TFT. Furthermore, the end surface of the source region, and the end surface of the source wiring coincide.

Further, under the source wirings (including the source electrode) and the pixel electrode 122, a gate insulating film, a first amorphous semiconductor film, and a second amorphous semiconductor film containing an impurity element which imparts n-type conductivity are laminated in order on the insulating substrate.

Besides, a storage capacitance is formed of the common wiring 103a, the pixel electrode 122 (or the second amorphous semiconductor film containing the impurity element which imparts the n-type conductivity, the first amorphous semiconductor film), and an insulating film 104b existing therebetween.

A second conductive film 124 made of a transparent electrode and being in contact with the source wiring, and a second conductive film 123 made of a transparent electrode and being in contact with the pixel electrode serve to prevent static electricity generated in a subsequent manufacturing step, especially in a rubbing processing. Besides, this second conductive film 124 facilitates electrical connection when connection with an FPC is made at a terminal portion.

Besides, although the IPS system is normally a transmission type, it is also possible to make a reflection type display device if a metal substrate or an insulating substrate on which a dielectric multi-layer film is formed is used as an opposite substrate and a substrate interval is made half of that of the transmission type.

An explanation of the present invention having the above structure is performed in more detail by the embodiments shown below.

EMBODIMENTS

Embodiment 1

An embodiment of the invention is explained using FIGS. 1 to 7. This Embodiment shows a method of manufacturing a liquid crystal display device, and a detailed explanation of a method of forming a TFT of a pixel portion on a substrate by a reverse stagger type TFT (channel etching type), and manufacturing a storage capacitor connected to the TFT, is made in accordance with the processes used. Further, a manufacturing process for a terminal section, formed in an edge portion of the substrate, and for electrically connecting to wirings of circuits formed on other substrates, is shown at the same time in the same figures.

In FIG. 2(A), a glass substrate, comprising such as barium borosilicate glass or aluminum borosilicate glass, typically Corning Corp. #7059 glass or #1737 glass, can be used as a substrate 100 having translucency. In addition, a translucent substrate such as a quartz substrate or a plastic substrate can also be used.

Figure 4:
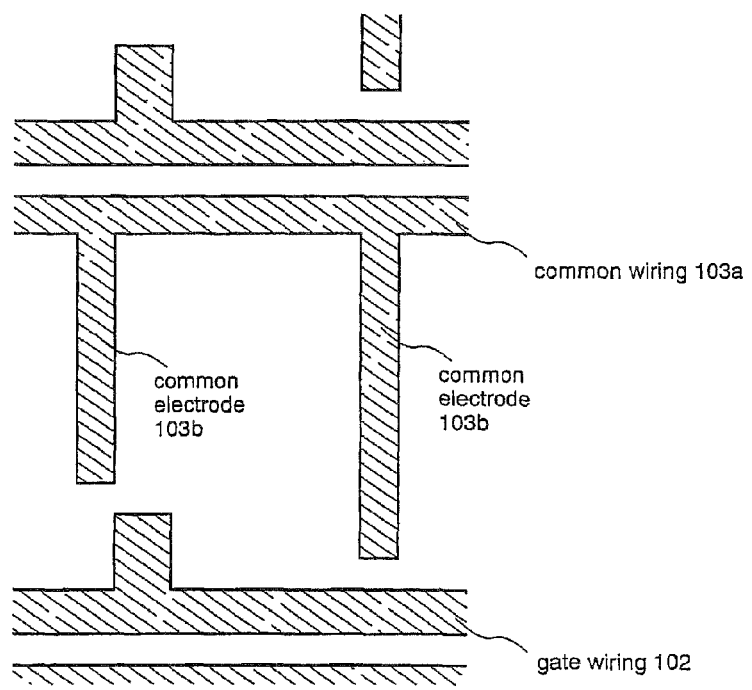
FIG. 4 is a top view showing the process of manufacturing the active matrix substrate.

Next, after forming a conductive layer on the entire surface of the substrate, a first photolithography process is performed, a resist mask is formed, unnecessary portions are removed by etching, and wirings and electrodes (the gate wiring 102 including a gate electrode, a common wiring 103a including a common electrode 103b and a terminal 101) are formed. Etching is performed at this time to form a tapered portion in at least an edge portion of the gate electrode 102. A top view of this stage is shown in FIG. 4.

It is preferable to form the gate wiring 102 including the gate electrode, the common wiring 103a, and the terminal 101 of the terminal portion from a low resistivity conductive material such as aluminum (Al), copper (Cu) or the like, but simple Al has problems such as inferior heat resistance and easily corrodes, and therefore it is combined with a heat resistant conductive material. Further, AgPdCu alloy may be used as the low resistivity conductive material. One element selected from the group consisting of titanium (Ti), tantalum (Ta), tungsten (W), molybdenum (Mo), chromium (Cr), Neodymium (Nd), or an alloy comprising the above elements, or an alloy film of a combination of the above element, or a nitrated compound comprising the above element is formed as the heat resistant conductive material. For example, a lamination of Ti and Cu or a lamination of TaN and Cu can be given. Furthermore, forming in combination with a heat resistant conductive material such as Ti, Si, Cr, or Nd, etc., it is preferable because of improved levelness. Further, only such heat resistant conductive film may also be formed, for example, in combination with Mo and W.

In realizing the liquid crystal display device, it is preferable to form the gate electrode and the gate wiring by a combination of a heat resistant conductive material and a low resistivity conductive material. An appropriate combination in this case is explained.

Provided that the screen size is on the order of, or less than 5 inch diagonal type, a two layer structure of a lamination of a conductive layer (A) made from a nitride compound of a heat resistant conductive material, and a conductive layer (B) made from a heat resistant conductive material is used. The conductive layer (B) may be formed from an element selected from the group consisting of Al, Cu, Ta, Ti, W, Nd, and Cr, or from an alloy of the above elements, or from an alloy film of a combination of the above elements, and the conductive layer (A) is formed from a film such as a tantalum nitride (TaN) film, a tungsten nitride (WN) film, or a titanium nitride (TiN) film. For example, it is preferable to use a double layer structure of a lamination of Cr as the conductive layer (A) and Al containing Nd as the conductive layer (B). The conductive layer (A) is given a thickness of 10 to 100 nm (preferably between 20 and 50 nm), and the conductive layer (B) is made with a thickness of 200 to 400 nm (preferably between 250 and 350 nm).

On the other hand, in order to be applied to a large screen, it is preferable to use a three layer structure of a lamination of a conductive layer (A) made from a heat resistant conductive material, a conductive layer (B) made from a low resistivity conductive material, and a conductive layer (C) made from a heat resistant conductive material. The conductive layer (B)

made from the low resistivity conductive material is formed from a material comprising aluminum (Al), and in addition to pure Al, Al containing between 0.01 and 5 atomic % of an element such as scandium (Sc), Ti, Nd, or silicon (Si), etc. is used. The conductive layer (C) is effective in preventing generation of hillocks in the Al of the conductive layer (B). The conductive layer (A) is given a thickness of 10 to 100 nm (preferably between 20 and 50 nm), the conductive layer (B) is made from 200 to 400 nm thick (preferable between 250 and 350 nm), and the conductive layer (C) is from 10 to 100 nm thick (preferably between 20 and 50 nm). In Embodiment 1, the conductive layer (A) is formed from a Ti film with a thickness of 50 nm, made by sputtering with a Ti target, the conductive layer (B) is formed from an Al film with a thickness of 200 nm, made by sputtering with an Al target, and the conductive layer (C) is formed from a 50 nm thick Ti film, made by sputtering with a Ti target.

An insulating film 104a is formed next on the entire surface. The insulating film 104a is formed using sputtering, and has a film thickness of 50 to 200 nm.

For example, a silicon nitride film is used as the insulating film 104a, and formed to a thickness of 150 nm. Of course, the gate insulating film is not limited to this type of silicon nitride film, and another insulating film such as a silicon oxide film, a silicon oxynitride film, or a tantalum oxide film may also be used, and the gate insulating film may be formed from a single layer or a lamination structure made from these materials. For example, a lamination structure having a silicon nitride film as a lower layer and a silicon oxide film as an upper layer may be used.

Next, a first amorphous semiconductor film 105 is formed with a thickness of 50 to 200 nm (preferably between 100 and 150 nm) on the insulating film 104a over the entire surface by using a known method such as plasma CVD or sputtering (not shown in the figure). Typically, an amorphous silicon (a-Si) film is formed with a thickness of 100 nm by sputtering using a silicon target. In addition, it is also possible to apply a microcrystalline semiconductor film, or a compound semiconductor film having an amorphous structure, such as an amorphous silicon germanium film ($Si_xGe_{(1-x)}$, (0<x<1)) and amorphous silicon carbide ($Si_xC_y$), etc., for the first amorphous semiconductor film.

A second amorphous semiconductor film containing an impurity element imparting one conductivity type (n-type or p-type) is formed next with a thickness of 20 to 80 nm. The second amorphous semiconductor film containing an impurity element imparting one conductivity type (n-type or p-type) is formed on the entire surface by a known method such as plasma CVD or sputtering. In this Embodiment the second amorphous semiconductor film 106 containing n-type impurity element is deposited by using a silicon target added with phosphorus (P). Alternatively, the second amorphous semiconductor film containing an impurity element imparting n-type may also be formed from a hydrogenated microcrystalline silicon film (pc-Si:H).

Next, a first conductive film 107 which comprises a metallic material is formed by sputtering or vacuum evaporation. There are no particular limitation on the material of the first conductive film 107 provided that the material is a metallic material which can form ohmic contact with the second amorphous semiconductor film 106, and an element selected from the group consisting of Al, Cr, Ta, and Ti, or an alloy comprising the above elements, and an alloy film of a combination of the above elements or the like can be given. Sputtering is used in this Embodiment to form a Ti film having 50 to 150 nm thickness, an aluminum (Al) having 300 to 400 nm thickness piled on the Ti film and further on the Al film a Ti film having 100 to 150 nm are formed as the first conductive film 107. (FIG. 2(A))

The insulating film 104a, the first amorphous semiconductor film 105, the second amorphous semiconductor film 106 containing an impurity element which imparts n-type, and the first conductive film 107 are all manufactured by a known method, and can be manufactured by plasma CVD or sputtering. The films (104a, 105, 106 and 107) are formed in succession by sputtering, and suitably changing the target or the sputtering gas in Embodiment 1. The same reaction chamber, or a plurality of reaction chambers, in the sputtering apparatus is used at this time, and it is preferable to laminate these films in succession without exposure to the atmosphere. By thus not exposing the films to the atmosphere, the mixing in of impurities can be prevented.

Next, a second photolithography process is performed, a resist masks 108 and 109 are formed, and by removing unnecessary portions by etching, a wiring (which forms a source wiring and a pixel electrode in the later step) is formed. Wet etching or dry etching is used as the etching process at this time. The first amorphous semiconductor film 105, the second amorphous semiconductor film 106 containing an impurity element imparting n-type and the conductive metal film 107 are etched, and a first amorphous semiconductor film 110, a second amorphous semiconductor film containing an impurity element imparting n-type 112 and a conductive metal film 114 are formed in the pixel TFT portion. Accordingly the edge surface of the films approximately coincide. Further in the capacitor portion a first amorphous semiconductor film 111, a second amorphous semiconductor film 113 containing an impurity element imparting n-type and a conductive metal film 115 are formed. Similarly, the edge surface of these films coincide. The first conductive film 107 formed by laminating a Ti film, an Al film and a Ti film in order is etched by dry etching using reaction gas of mixed gas of $SiCl_4$, $Cl_2$ and $BCl_3$ and the first amorphous semiconductor film 105 and the second amorphous semiconductor film 106 containing an impurity element which imparts n-type are selectively removed by changing the reaction gas to the mixed gas of $CF_4$ and $O_2$. (FIG. 2(B)) In the terminal portion a terminal 101 and an insulating film 104a remained.

Next after removing resist masks 108 and 109, a resist mask is formed by a shadow mask, an insulating film 104b is formed by selectively removing the insulating film 104a which covers the pad portion of the terminal portion and the resist mask is removed. (FIG. 2(C)) Further, the resist mask may be formed by screen printing in place of the shadow mask and it may be used as the etching mask.

Figure 5:
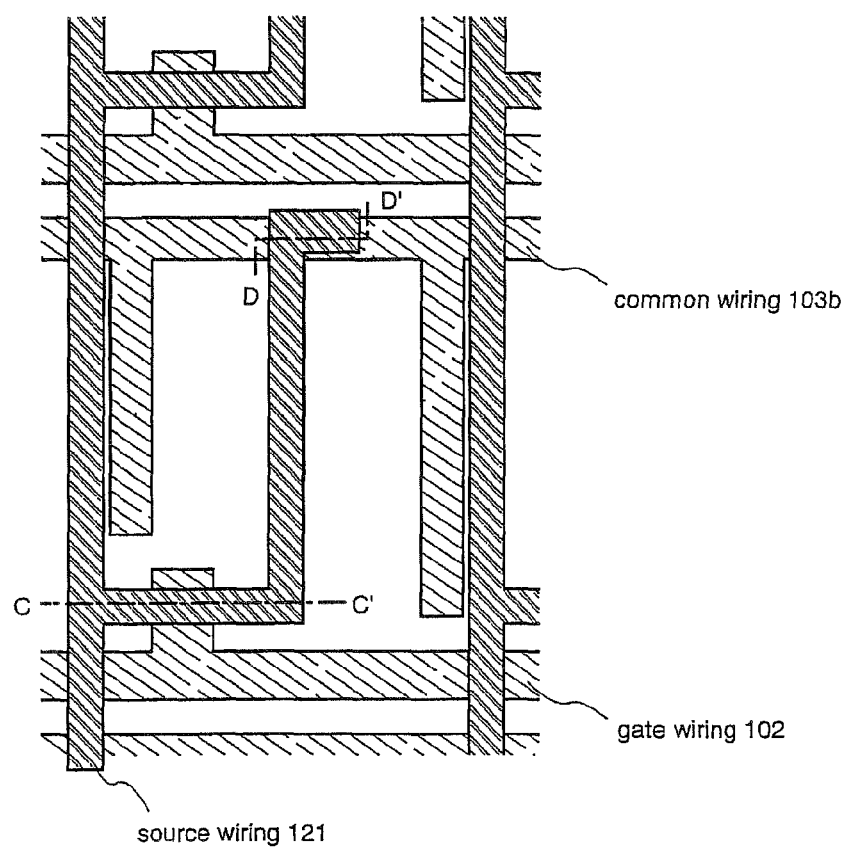
FIG. 5 is a top view showing the process of manufacturing the active matrix substrate.

Next, a second conductive film 116 comprising a transparent conductive film is deposited over the entire surface. (FIG. 2(D)) A top view in this state is shown in FIG. 5. Note however, for simplification, the second conductive film 116 deposited over the entire surface is not shown in FIG. 5.

The second conductive film 116 is formed from a material such as indium oxide ($In_2O_3$) or indium tin oxide alloy ($In_2O_3$—$SnO_2$, abbreviated as ITO) using a method such as sputtering or vacuum evaporation. The etching process for this type of material is performed using a solution of hydrochloric acid type. However, a residue is easily generated, particularly by ITO etching, and therefore an indium oxide zinc oxide alloy ($In_2O_3$—$ZnO$) may be used in order to improve the etching workability. The indium oxide zinc oxide alloy has superior surface smoothing characteristics, and has superior thermal stability compared to ITO, and therefore even if the wiring 111 contacting the second conductive film 116 is made from an Al film, a corrosion reaction can be prevented. Similarly, zinc oxide (ZnO) is also a suitable material, and in addition, in order to increase the transmittivity of visible light and increase the conductivity, a material such as zinc oxide in which gallium (Ga) is added (ZnO:Ga) can be used.

Resist masks 117a to 117c are formed next by a third photolithography process. Unnecessary portions are then removed by etching, forming a first amorphous semiconductor film 118, a source region 119, a drain region 120, the source wiring 121 and the pixel electrode 122, and the second conducive films 123 and 124. (FIG. 3(A))

The third photolithography process patterns the second conductive film 116, and at the same time removes a part of the wiring 114, the second amorphous semiconductor film containing an impurity element which imparts n-type 112 and the first amorphous semiconductor film 110 by etching, forming an opening. In this Embodiment, the second conductive film 116 comprising ITO is selectively removed first by wet etching using a mixed solution of nitric acid and hydrochloric acid, or a ferric chloride solution, and after removing the wiring 114 by wet etching, a part of the second amorphous semiconductor film 112 containing an impurity element which imparts n-type and the amorphous semiconductor film 110 are etched by dry etching. Note that wet etching and dry etching are used in this Embodiment, but the operator may perform only dry etching by suitably selecting the reaction gas, and the operator may perform only wet etching by suitably selecting the reaction solution.

Further, the lower portion of the opening reaches the first amorphous semiconductor film, and the amorphous semiconductor film 118 is formed having a concave portion. The wiring 114 is separated into the source wiring 121 and the pixel electrode 122 by the opening, and the second amorphous semiconductor film containing an impurity element which imparts n-type 112 is separated into the source region 119 and the drain region 120. Furthermore, the second conductive film 124 contacting the source wiring covers the source wiring, and during subsequent manufacturing processes, especially during a rubbing process, fulfills a role of preventing static electricity from developing. Further, as shown in FIG. 9, this second conductive film 124 plays an important role in forming connection with FPC in the terminal portion. Also, this second conductive film 124 plays a role of protecting the source wiring.

Further, a storage capacitor is formed, in this third photolithography process, between the common wiring 103a and the pixel electrode 122 with the insulating film 104b in the capacitor portion as a dielectric.

In this third photolithography process, the second conductive film comprising a transparent conductive film formed in the terminal portion is remained by covering with the resist mask 117c.

Resist masks 113a to 113c are next removed. The cross sectional view of this state is shown in FIG. 3(B).

Furthermore, FIG. 9(A) shows top views of a gate wiring terminal portion 501 and a source wiring terminal portion 502 in this state. Note that the same symbols are used for area corresponding to those of FIG. 1 to FIG. 3. Further, FIG. 9(B) corresponds to a cross-sectional view taken along the lines E-E' and F-F' in FIG. 9(A). Reference numeral 503 in FIG. 9(A) comprising a transparent conductive film denotes a connecting electrode which functions as an input terminal and it enables easy electrical connection. In addition, in FIG. 9(B) reference numeral 504 denotes an insulating film (extended from 104b), reference numeral 505 denotes a first amorphous semiconductor film (extended from 118), and reference numeral 506 denotes a second amorphous semiconductor film containing an impurity element which imparts n-type (extended from 119).

Thus by thus using three photomasks and performing three photolithography processes, the pixel TFT portion having the reverse stagger type n-channel type TFT 201 and the storage capacitor 202 can be completed. By placing these in a matrix state corresponding to each pixel and thus composing the pixel portion, one substrate can be made in order to manufacture an active matrix type electro-optical device. For convenience, this type of substrate is referred to as an active matrix substrate throughout this specification.

An alignment film 125 is selectively formed next in only the pixel portion of the active matrix substrate. Screen printing may be used as a method of selectively forming the alignment film 125, and a method of removal in which a resist mask is formed using a shadow mask after application of the alignment film may also be used. Normally, a polyimide resin is often used in the alignment film of the liquid crystal display element. In this Embodiment AL 3046 (manufactured by JSR Corporation) is used as the alignment film.

Next, a rubbing process is then performed on the alignment film 125, orienting the liquid crystal elements so as to possess a certain fixed pre-tilt angle. In case of the IPS method, the preferable pre-tilt angle is approximately 0.5° to 3°, in order to prevent coloring and to obtain good viewing angle, and in this Embodiment it is set at 1.5°.

After the active matrix substrate and an opposing substrate 127 on which an alignment film 126 is formed are next joined together by a sealant while maintaining a gap between the substrates using spacers, a liquid crystal material 128 is injected into the space between the active matrix substrate and the opposing substrate. Sphere shaped spacers or columnar spacers can be used as the spacers. The number of mask is reduced by one when the columnar spacers are used, and the space between the substrates can be made more uniform and further the process for spraying can be omitted. Note that though not shown in the figure, there is a region on the opposing substrate, which does not substantially function as the display region is covered with a black mask here. A known n-type liquid crystal or a p-type liquid crystal used in the IPS method may be applied to the liquid crystal material 128.

In this Embodiment a p-type liquid crystal material ZLI-4792 (manufactured by Merck) in which a pair of substrates are held 3 to 5 μm distance is preferable, is used in this Embodiment. In case of using ZLI-2806 (manufactured by Merck) is used, a pair of substrates are held a distance of 6 to 8 μm, and the transmitting light and the response speed may be optimized. The angle formed between the pixel electrode and the rubbing direction is preferably set 0.5° to 40° in absolute value since a p-type liquid crystal is used, and it is set at 15° in this Embodiment. On the other hand, in case of using n-type liquid crystal, the angle formed between the pixel electrode and the rubbing direction with respect to the axis intersecting perpendicular to the pixel electrode is set at between 0.5° to 40° in absolute value.

After injecting liquid crystal material next, the opening for injection is sealed by a resin material.

Next, a flexible printed circuit (FPC) is connected to the input terminal 101 of the terminal portion. The FPC is formed by a copper wiring 131 on an organic resin film 132 such as polyimide, and is connected to the transparent conductive film which covers the input terminal by an anisotropic conductive adhesive. The anisotropic conductive adhesive comprises an adhesive 129 and particles 130, with a diameter of several tens to several hundreds of μm and having a conductive surface plated by a material such as gold, which are mixed therein. The particles 130 form an electrical connection in this portion by connecting the transparent conductive film on the input terminal 101 and the copper wiring 131. In addition, in order to increase the mechanical strength of this region, a resin layer 133 is formed. (FIG. 3(C))

Note that FIG. 1 is a top view of one pixel and the cross sections taken along A-A' line and B-B' line corresponds respectively to FIG. 3(C). For simplification the opposing substrate on which the alignment film is disposed and the liquid crystal are not shown in the figure.

Figure 6:
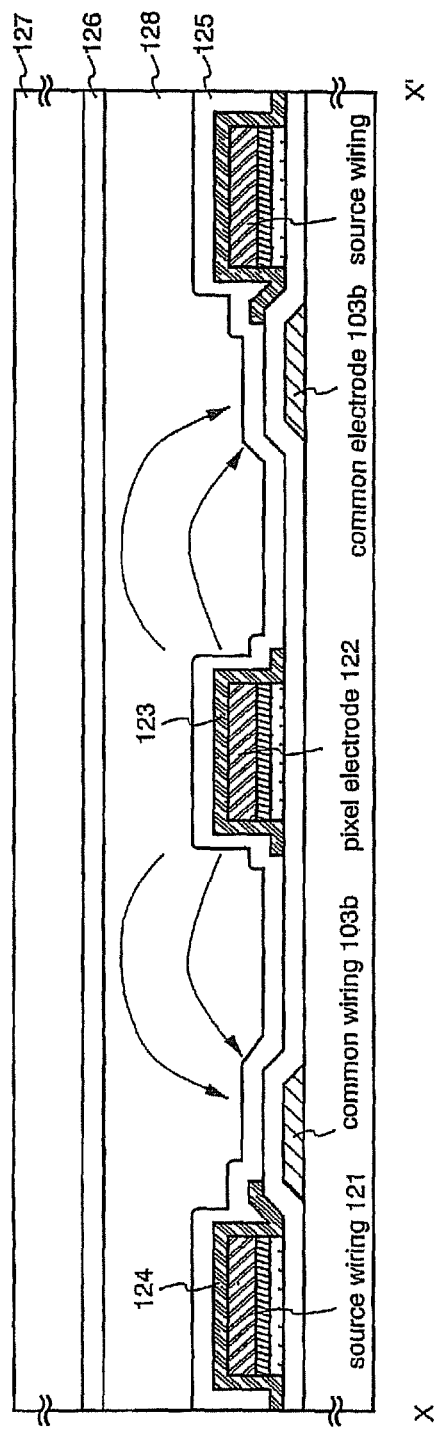
FIG. 6 is a cross-sectional view of a liquid crystal display device.

FIG. 6 is a cross sectional view taken along the chain line X-X' in FIG. 1. The common wiring 103a is divided into branches and the portion divided into branches is referred to as common electrode 103b and the portion parallel to the gate wiring is referred to as common wiring 103a through the Specification, for convenience. The pixel electrode 122 is disposed between two common electrodes 103b. Further, the pixel electrode 122 and the common electrode 103b are formed in different layers. An electric field is applied by them, between the pixel electrode 122 and the common electrode 103b on one substrate, and the direction is set to be approximately parallel to the substrate interface.

Figure 7:
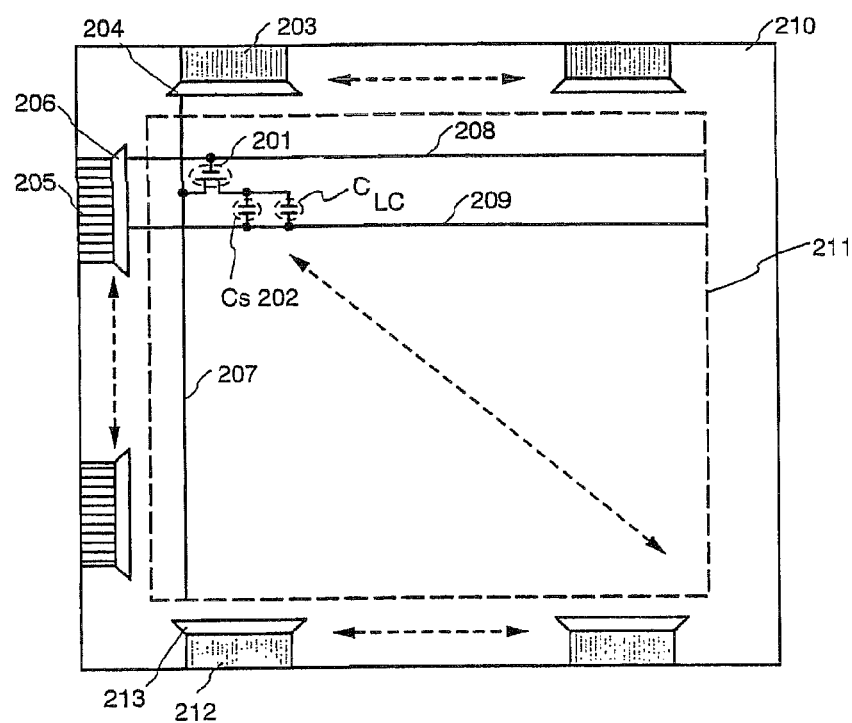
FIG. 7 is a top view for explaining the arrangement of a pixel portion and an input terminal portion of a liquid crystal display device.

FIG. 7 is a diagram explaining the arrangement of the pixel section and the terminal section of an active matrix substrate. A pixel section 211 is disposed on the substrate 210, a gate wiring 208 and a source wiring 207 are formed to intersect in the pixel section and an n-channel TFT 201 is disposed connected to these is disposed corresponding to each pixel. A pixel electrode 119 and a storage capacitor 202 are connected to the drain side of the n-channel TFT 201 and the other terminal of the storage capacitor 202 is connected to the common wiring 209. The structures of the n-channel TFT 201 and the storage capacitor 202 are the same as the n-channel TFT 201 and the storage capacitor 202 shown in FIG. 3(B).

An input terminal section 205 which inputs scanning signal is formed in one edge portion of the substrate and is connected to the gate wiring 208 by the connecting wiring 206. Further, an input terminal portion 203 which inputs image signal is formed in another edge portion and it is connected to the source wiring 207 by the connecting wiring 204. Gate wiring 208, source wiring 207 and common wiring 209 are disposed in plural numbers corresponding to the pixel density. It is also appropriate to dispose an input terminal 212 which inputs image signals and the connecting wiring 213, and connect to the source wiring alternately with the input terminal portion 203. The input terminal portions 203, 205 and 212 may be disposed in arbitrary number respectively, and it may be properly determined by the operator.

Embodiment 2

Figure 8:
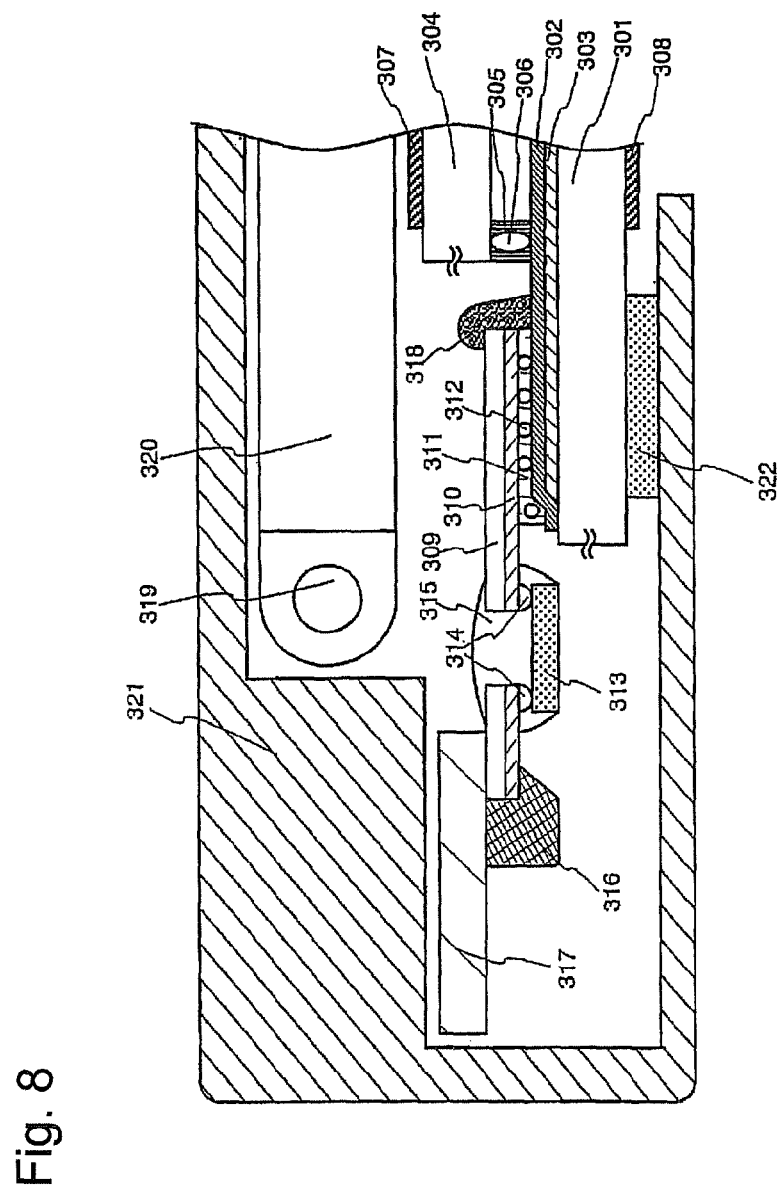
FIG. 8 is a cross-sectional view showing an implemented structure of a liquid crystal display device.

FIG. 8 is an example of a method of mounting a liquid crystal display device. The liquid crystal display device has an input terminal portion 302 formed in an edge portion of a substrate 301 on which TFTs are formed, and as shown by embodiment 1, this is formed by a terminal 303 formed from the same material as a gate wiring. An opposing substrate 304 is joined to the substrate 301 by a sealant 305 encapsulating spacers 306, and in addition, polarizing plates 307 and 308 and a color filter (not shown) are disposed. Note that the arrangement of one of the polarizing plate may be adjusted to the longer axis of the liquid crystal molecule and the arrangement of the other polarizing plate may be adjusted to the shorter axis of the liquid crystal molecule. This is then fixed to a casing 321 by spacers 322.

Note that the TFT obtained in Embodiment 1 having an active layer formed by an amorphous silicon film has a low electric field effect mobility, and only approximately 1 cm$^2$/Vsec is obtained. Therefore, a driver circuit for performing image display is formed by an IC chip, and mounted by a TAB (tape automated bonding) method or by a COG (chip on glass) method. In this Embodiment, an example is shown of forming the driver circuit in an IC chip 313, and mounting by using the TAB method. A flexible printed circuit (FPC) is used, and the FPC is formed by a copper wiring 310 on an organic resin film 309, such as polyimide, and is connected to the input terminal 302 by an anisotropic conductive adhesive. The input terminal is a transparent conductive film formed on and contacting the wiring 303. The anisotropic conductive adhesive is structured by an adhesive 311 and particles 312, with a diameter of several tens to several hundreds of μm and having a conductive surface plated by a material such as gold, which are mixed therein. The particles 312 form an electrical connection in this portion by connecting the input terminal 302 and the copper wiring 310. In addition, in order to increase the mechanical strength of this region, a resin layer 318 is formed.

The IC chip 313 is connected to the copper wiring 310 by a bump 314, and is sealed by a resin material 315. The copper wiring 310 is then connected to a printed substrate 317 on which other circuits such as a signal processing circuit, an amplifying circuit, and a power supply circuit are formed, through a connecting terminal 316. A light source 319 and a light conductor 320 are formed on the opposing substrate 304 and used as a back light in the transmission type liquid crystal display device.

Embodiment 3

Figure 14:
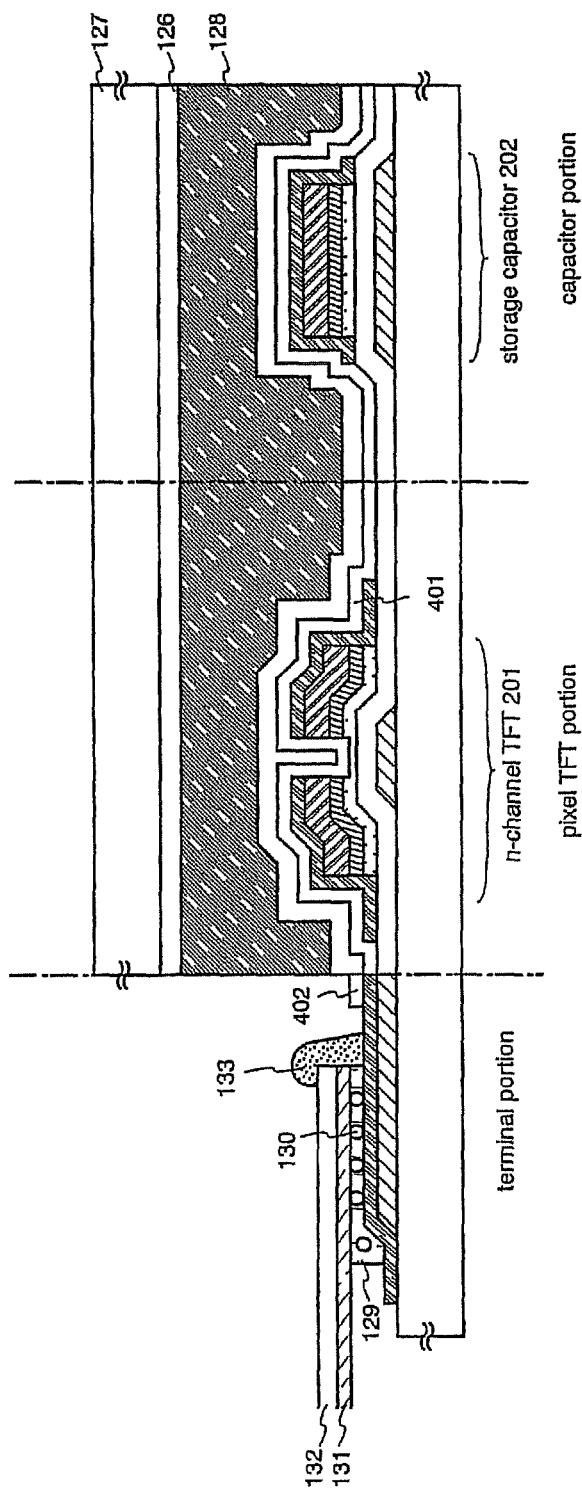
FIG. 14 is a cross-sectional view showing an implemented structure of a liquid crystal display device.

In this Embodiment, an example of forming a protecting film is shown in FIG. 14. Note that this Embodiment is identical to Embodiment 1 through the state of FIG. 3(B), and therefore only points of difference are explained. Further, the same symbols are used for locations corresponding to those in FIG. 3(B).

After first forming through the state of FIG. 3(B) in accordance with Embodiment 1, a thin inorganic insulating film is formed on the entire surface. An inorganic insulating film formed by using plasma CVD or sputtering such as a silicon oxide film, a silicon nitride film, a silicon oxynitride film, or a tantalum oxide film is used as the thin inorganic insulating film, and a single layer or a lamination structure made from these materials may be formed.

A forth photolithography process is performed next, forming a resist mask, and unnecessary portions are removed by etching, forming an insulating film 402 in the pixel TFT portion, and an inorganic insulating film 401 in the terminal portion. These inorganic insulating films 401 and 402 function as passivation films. Further, the thin inorganic insulating film 401 is removed in the terminal portion by the fourth photolithography process, exposing the second conductive film comprising a transparent conductive film formed on the terminal 101 of the terminal portion.

The reverse stagger type n-channel type TFT and the storage capacitor, protected by the inorganic insulating film, can thus be completed in this Embodiment by performing the photolithography process using four photomasks four times in total. By thus structuring the pixel portion by arranging these into a matrix state corresponding to each pixel, one substrate for manufacturing the active matrix electro-optical device can be made.

Note that it is possible to freely combine the present Embodiment with constitutions of Embodiment 1 or Embodiment 2.

Embodiment 4

In Embodiment 1 an example centering on laminating an insulating film, a first amorphous semiconductor film, a second amorphous semiconductor film containing an impurity element which imparts n-type conductivity, and a first conductive film by sputtering, but this Embodiment shows an example of using plasma CVD to form the films.

The insulating film, the first amorphous semiconductor film, and the second amorphous semiconductor film containing an impurity element which imparts n-type conductivity are formed by plasma CVD in this Embodiment.

In this Embodiment, a silicon oxynitride film is used as the insulating film, and formed with a thickness of 150 nm by plasma CVD. Deposition may be performed at this point in a plasma CVD apparatus with a power supply frequency of 13 to 70 MHz, preferably between 27 and 60 MHz. By using a power supply frequency of 27 to 60 MHz, a dense insulating film can be formed, and the voltage resistance can be increased as a gate insulating film. Further, a silicon oxynitride film manufactured by adding $N_2O$ to $SiH_4$ and $NH_3$ has a reduced fixed electric charge density in the film, and therefore is a material which is preferable for this use. Of course, the gate insulating film is not limited to this type of silicon oxynitride film, and a single layer or a lamination structure using other insulating films such as s silicon oxide film, a silicon nitride film, or a tantalum oxide film may be formed. Further, a lamination structure of a silicon nitride film in a lower layer, and a silicon oxide film in an upper layer may be used.

For example, when using a silicon oxide film, it can be formed by plasma CVD using a mixture of tetraethyl orthosilicate (TEOS) and $O_2$, with the reaction pressure set to 40 Pa, a substrate temperature of 250 to 350° C., and discharge at a high frequency (13.56 MHz) power density of 0.5 to 0.8 $W/cm^2$. Good characteristics as the gate insulating film can be obtained for the silicon oxide film thus formed by a subsequent thermal anneal at 300 to 400° C.

Typically, a hydrogenated amorphous silicon (a-Si:H) film is formed with a thickness of 100 nm by plasma CVD as the first amorphous semiconductor film. At this point, the deposition may be performed with a power supply frequency of 13 to 70 MHz, preferably between 27 and 60 MHz, in the plasma CVD apparatus. By using a power frequency of 27 to 60 MHz, it becomes possible to increase the film deposition speed, and the deposited film is preferable because it becomes an a-Si film having a low defect density. In addition, it is also possible to apply a microcrystalline semiconductor film and a compound semiconductor film having an amorphous structure, such as an amorphous silicon germanium film, as the first amorphous semiconductor film.

Further, if 100 to 100 kHz pulse modulation discharge is performed in the plasma CVD film deposition of the insulating film and the first amorphous semiconductor film, then particle generation due to the plasma CVD gas phase reaction can be prevented, and pinhole generation in the film deposition can also be prevented, and therefore is preferable.

Further, in this Embodiment a second amorphous semiconductor film containing an impurity element which imparts n-type conductivity is formed with a thickness of 20 to 80 nm as a semiconductor film containing a single conductivity type impurity element. For example, an a-Si:H film containing n-type impurity element may be formed, and in order to do so, phosphine ($PH_3$) is added at a 0.1 to 5% concentration to silane ($SiH_4$). Alternatively, a hydrogenated microcrystalline silicon film (pc-Si:H) may also be used as a substitute for the second amorphous semiconductor film 106 containing an impurity element which imparts n-type conductivity.

These films can be formed in succession by appropriately changing the reaction gas. Further, these films can be laminated successively without exposure to the atmosphere at this time by using the same reaction chamber or a plurality of reaction chambers in the plasma CVD apparatus. By thus depositing successively these films without exposing the films to the atmosphere, the mixing in of impurities into the first amorphous semiconductor film can be prevented.

Note that it is possible to combine this Embodiment with any one of Embodiments 1 to 3.

Embodiment 5

Examples are shown in Embodiment 1 and Embodiment 4 of laminating an insulating film, a first amorphous semiconductor film, a second amorphous semiconductor film containing an impurity element which imparts n-type, and a first conductive film, in order and in succession. An example of an apparatus prepared with a plurality of chambers, and used for cases of performing this type of successive film deposition is shown in FIG. 10.

Figure 10:
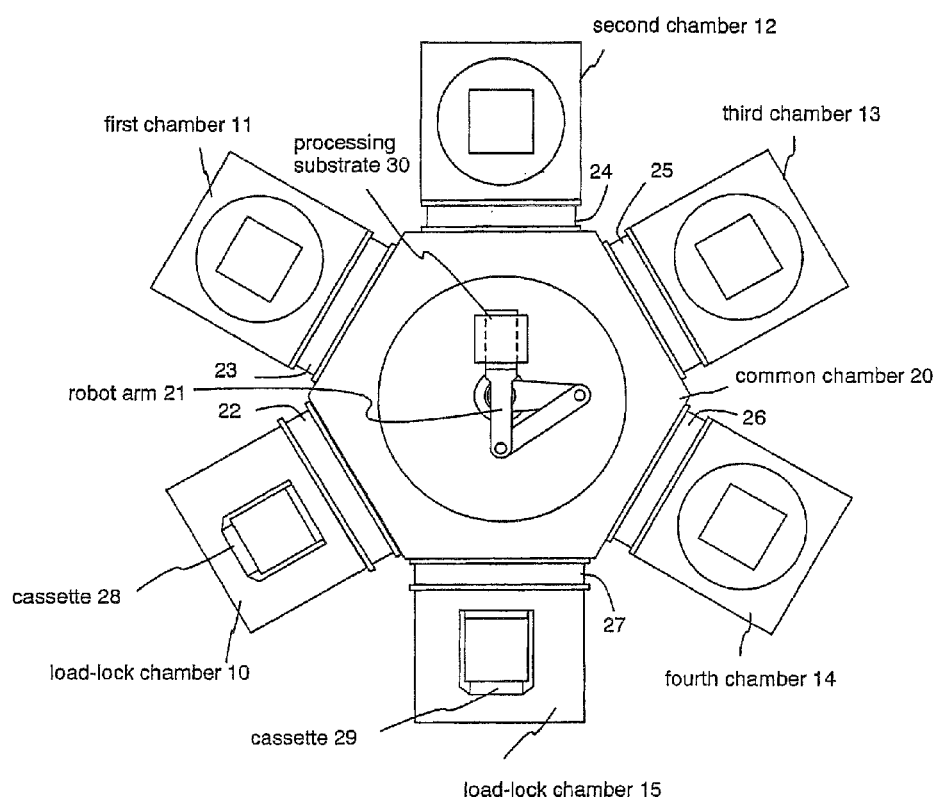
FIG. 10 is a top view of a manufacturing device.

An outline as seen from above of an apparatus (successive film deposition system), shown by this Embodiment, is shown in FIG. 10. Reference numerals 10 to 15 in FIG. 10 denote chambers having airtight characteristics. A vacuum evacuation pump and an inert gas introduction system are arranged in each of the chambers.

The chambers denoted by reference numerals 10 and 15 are load-lock chambers for bringing test pieces (processing substrates) 30 into the system. The chamber denoted by reference numeral 11 is a first chamber for deposition of the insulating film 104. The chamber denoted by reference numeral 12 is a second chamber for deposition of the first amorphous semiconductor film 105. The chamber denoted by reference numeral 13 is a third chamber for deposition of the second amorphous semiconductor film 106 which imparts n-type conductivity. The chamber denoted by reference numeral 14 is a fourth chamber for deposition of the first conductive film 107. Further, reference numeral 20 denotes a common chamber of the test pieces, arranged in common with respect to each chamber.

An example of operation is shown below.

After pulling a high vacuum state in all of the chambers at first, a purge state (normal pressure) is made by using an inert gas, nitrogen here. Furthermore, a state of closing all gate valves 22 to 27 is made.

First, a cassette 28 loaded with a multiple number of processing substrates is placed into the load-lock chamber 10. After the cassette is placed inside, a door of the load-lock chamber (not shown in the figure) is closed. In this state, the gate valve 22 is opened and one of the processing substrates 30 is removed from the cassette, and is taken out to the common chamber 20 by a robot arm 21. Position alignment is performed in the common chamber at this time. Note that a substrate on which the wirings 101, 102, 103a and 103b are formed, obtained in accordance with Embodiment 1, is used for the substrate 30.

The gate valve 22 is then closed, and a gate valve 23 is opened next. The processing substrate 30 is then moved into the first chamber 11. Film deposition processing is performed within the first chamber at a temperature of 150 to 300° C., and the insulating film 104 is obtained. Note that a film such as a silicon nitride film, a silicon oxide film, a silicon oxynitride film, or a lamination film of these films, can be used as the insulating film. A single layer silicon nitride film is employed in this Embodiment, but a two-layer, three-layer, or higher layer lamination structure film may also be used. Note that a chamber capable of plasma CVD is used here, but a chamber which is capable of sputtering by use of a target may also be used.

After completing the deposition of the insulating film, the processing substrate is pulled out into the common chamber by the robot arm, and is then transported to the second chamber 12. Film deposition is performed within the second chamber at a temperature of 150 to 300° C., similar to that of the first chamber, and the first amorphous semiconductor film 105 is obtained by plasma CVD. Note that a film such as a microcrystalline semiconductor film, an amorphous germanium film, an amorphous silicon germanium film, or a lamination film of these films, etc., can be used as the first amorphous semiconductor film. Further, a heat treatment process for reducing the concentration of hydrogen may be omitted with a formation temperature of 350 to 500° C. for the first amorphous semiconductor film. Note that a chamber capable of plasma CVD is used here, but a chamber which is capable of sputtering by use of a target may also be used.

After completing deposition of the first amorphous semiconductor film, the processing substrate is pulled out into the common chamber and then transported to the third chamber 13. Film deposition process is performed within the third chamber at a temperature of 150° C. to 300° C., similar to that of the second chamber, and the second amorphous semiconductor film 106, containing an impurity element which imparts n-type conductivity (P or As), is obtained by plasma CVD. Note that a chamber capable of plasma CVD is used here, but a chamber which is capable of sputtering by use of a target may also be used.

After completing deposition of the second amorphous semiconductor film containing an impurity element which imparts n-type conductivity, the processing substrate is pulled out into the common chamber, and then is transported to the fourth chamber 14. The first conductive film 107 is obtained within the fourth chamber by sputtering using a metallic target.

The processed substrate, on which four layers have thus been formed in succession, is then transported to the load-lock chamber 15 by the robot arm, and is contained in a cassette 29.

Note that the apparatus shown in FIG. 10 is only one example. Further, it is possible to freely combine this Embodiment with any one of Embodiments 1 to 4.

Embodiment 6

Figure 11:
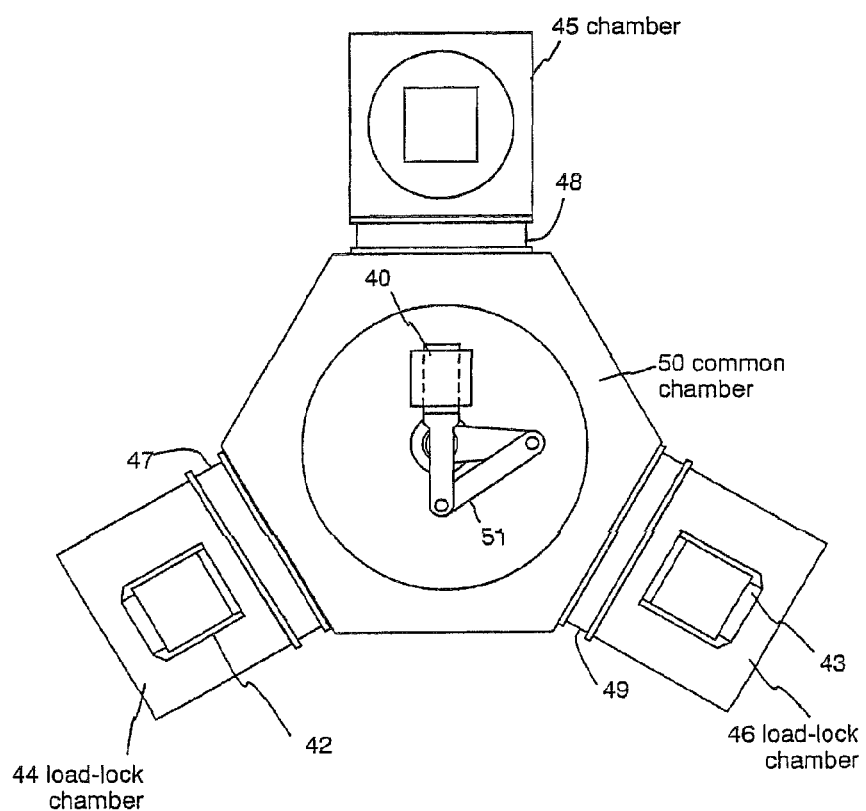
FIG. 11 is a top view of a manufacturing device.

In Embodiment 5, an example of successive lamination using a plurality of chambers is shown, but in this Embodiment a method of successive lamination within one chamber maintained at high vacuum using the apparatus shown in FIG. 11 is employed.

The apparatus system shown in FIG. 11 is used in this Embodiment. In FIG. 11, reference numeral 40 denotes a processing substrate, reference numeral 50 denotes a common chamber, 44 and 46 denote load-lock chambers, 45 denotes a chamber, and reference numerals 42 and 43 denote cassettes. In order to prevent contamination developing during transport of the substrate, lamination is performed in the same chamber in this Embodiment.

It is possible to freely combine this Embodiment with any one of Embodiments 1 to 4.

Note however, when applied to Embodiment 1, a plurality of targets are prepared in the chamber 45, and the insulating film 104, the first amorphous semiconductor film 105, the second amorphous semiconductor film 106 containing an impurity element which imparts n-type conductivity, and the first conductive film 107 may be laminated by changing the reaction gas in order.

Further, when applied to Embodiment 4, the insulating film 104, the first amorphous semiconductor film 105, and the second amorphous semiconductor film 106 containing an impurity element which imparts n-type conductivity, may be laminated by changing the reaction gas in order.

Embodiment 7

In Embodiment 1, an example of forming the second amorphous semiconductor film containing an impurity element which imparts n-type by using sputtering is shown, but in this Embodiment an example of forming it by using plasma CVD is shown. Note that, except for the method of forming the second amorphous semiconductor film containing an impurity element which imparts n-type, this Embodiment is identical to Embodiment 1, and therefore only differing points are stated below.

If phosphine ($PH_3$) is added at a concentration of 0.1 to 5% with respect to silane ($SiH_4$) as a reaction gas using plasma CVD, then the second amorphous semiconductor film containing an impurity element which imparts n-type can be obtained.

Embodiment 8

In Embodiment 7, an example of forming the second amorphous semiconductor film containing an impurity element which imparts n-type by using plasma CVD is shown, and in this Embodiment, an example of using a microcrystalline semiconductor film containing an impurity element which imparts n-type conductivity is shown.

By setting the deposition temperature from 80 to 300° C., preferably between 140 and 200° C., taking a gas mixture of silane diluted by hydrogen ($SiH_4$: $H_2$=1:10 to 100) and phosphine ($PH_3$) as the reaction gas, setting the gas pressure from 0.1 to 10 Torr, and setting the discharge power from 10 to 300 mW/cm$^2$, a microcrystalline silicon film can be obtained. Further phosphorous may be added by plasma doping after film deposition of this microcrystalline silicon film.

Embodiment 9

Figure 12:
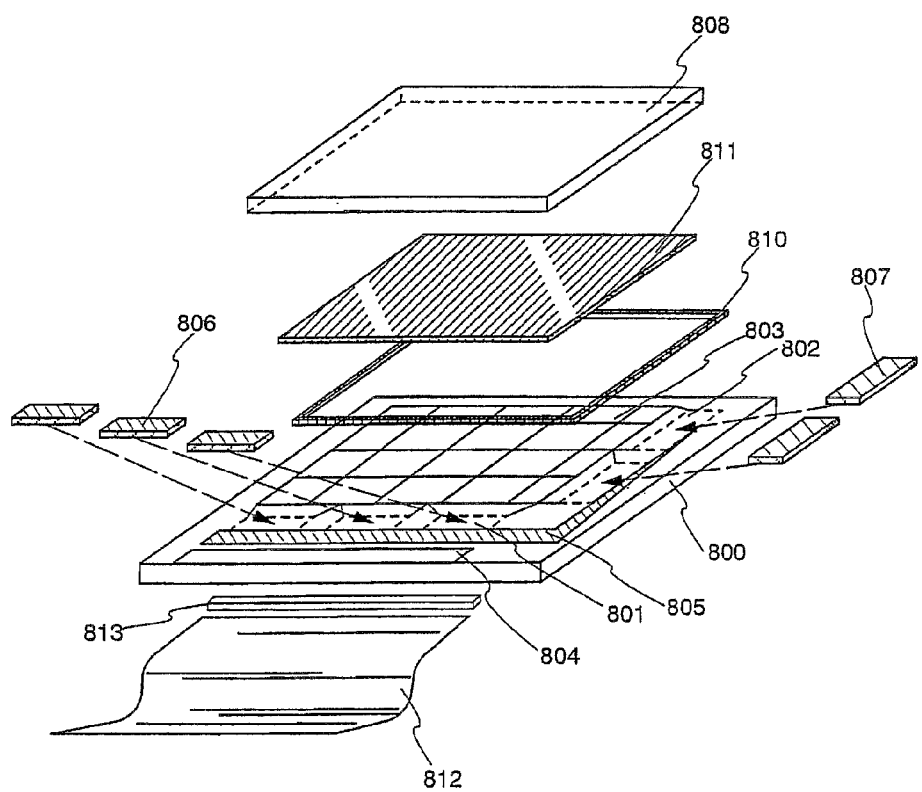
FIG. 12 is a diagram showing an implementation of a liquid crystal display device.

FIG. 12 is a diagram which schematically shows a state of constructing an electro-optical display device by using the COG method. A pixel region 803, an external input-output terminal 804, and a connection wiring 805 are formed on a first substrate. Regions surrounded by dotted lines denote a region 801 for attaching a scanning line side IC chip, and a region 802 for attaching a data line side IC chip. An opposing electrode 809 is formed on a second substrate 808, and this is joined to the first substrate 800 by using a sealing material 810. A liquid crystal layer 811 is formed inside the sealing material 810 by injecting a liquid crystal. The first substrate and the second substrate are joined with a predetermined gap, and this is set from 3 to 8•for a nematic liquid crystal.

IC chips 806 and 807 have circuit structures which differ between the data line side and the scanning line side. The IC chips are mounted on the first substrate. An FPC (flexible printed circuit) 812 is attached to the external input-output terminal 804 in order to input power supply and control signals from the outside. In order to increase the adhesion strength of the FPC 812, a reinforcing plate 813 may be formed. The electro-optical device can thus be completed. If an electrical inspection is performed before mounting the IC chips on the first substrate, then the final process yield of the electro-optical device can be improved, and the reliability can be increased.

Figure 13:
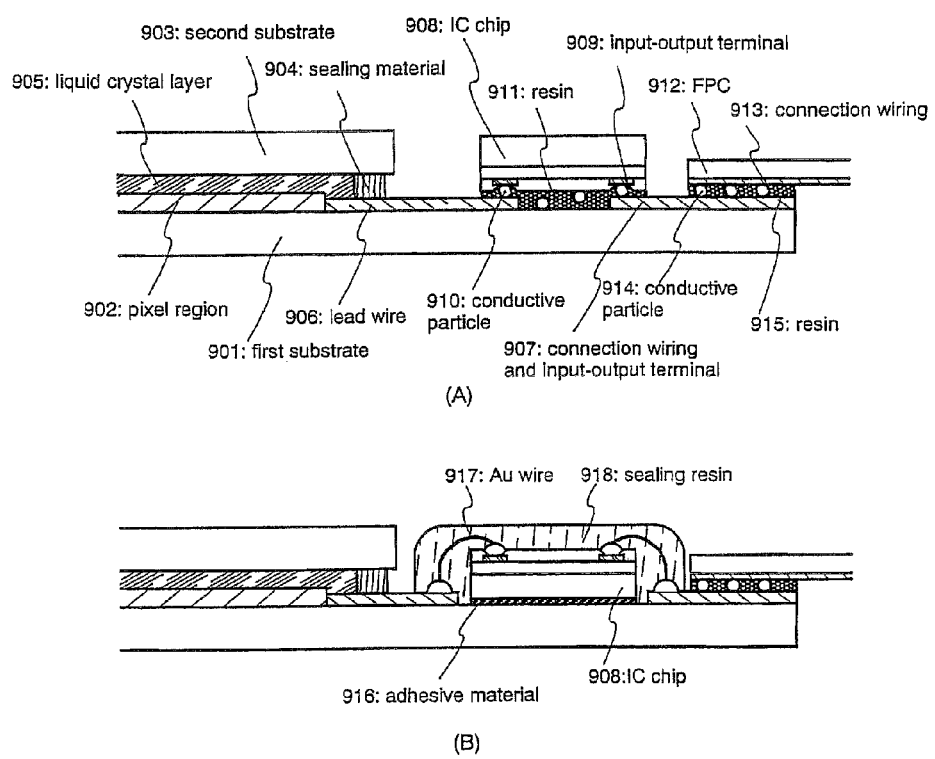
FIGS. 13A-B are cross-sectional views showing an implementation structure of a liquid crystal display device.

Further, a method such as a method of connection using an anisotropic conductive material or a wire bonding method, can be employed as the method of mounting the IC chips on the first substrate. FIG. 13 show an example of such. FIG. 13(A) shows an example in which an IC chip 908 is mounted on a first substrate 901 using an anisotropic conductive material. A pixel region 902, a lead wire 906, a connection wiring and an input-output terminal 907 are formed on the first substrate 901. A second substrate is bonded to the first substrate 901 by using a sealing material 904, and a liquid crystal layer 905 is formed therebetween.

Further, an FPC 912 is bonded to one edge of the connection wiring and the input-output terminal 907 by using an anisotropic conductive material. The anisotropic conductive material is made from a resin 915 and conductive particles 914 having a diameter of several tens to several hundreds of μm and plated by a material such as Au, and the connection wiring 913 formed with the FPC 912 and the connection wiring and input-output terminal 907 are electrically connected by the conductive particles 914. The IC chip 908 is also similarly bonded to the first substrate by an anisotropic conductive material. An input-output terminal 909 provided with the IC chip 908 and the lead wire 906, or a connection wiring and the input-output terminal 907 are electrically connected by conductive particles 910 mixed into a resin 911.

Furthermore, as shown by FIG. 13(B), the IC chip may be fixed to the first substrate by an adhesive material 916, and an input-output terminal of an IC chip and a lead wire or a connection wiring may be connected by an Au wire 917. Then, this is all sealed by a resin 918.

The method of mounting the IC chip is not limited to the method based on FIGS. 12 and 13, and it is also possible to use a known method not explained here, such as a COG method, a wire bonding method or a TAB method.

It is possible to freely combine this Embodiment with Embodiment 1, 3 or 8.

Embodiment 10

In the embodiment 1, although the description has been made on the example in which the transparent conductive film covering the pixel electrode and the source electrode is formed, in this embodiment, an example in which a transparent conductive film is not formed will be described by use of FIG. 15.

In accordance with the embodiment 1, the state of FIG. 2(C), that is, a gate wiring 602, a common wiring 603a, a common electrode 603b, and a wiring (which becomes a source wiring and a pixel electrode in a subsequent step) are obtained.

Resist mask is formed next by a third photolithography process. Unnecessary portion is then removed by etching, forming a first amorphous semiconductor film, a source region, a drain region, the source wiring 621, and the pixel electrode 622.

The third photolithography process removes the wiring the second amorphous semiconductor film containing an impurity element which imparts n-type conductivity and a portion of the first amorphous semiconductor film by etching, forming an opening. In the embodiment 1, after selectively removing the wiring 111 by wet etching and forming the source wiring 621 and the pixel electrode 622, the second amorphous semiconductor film, containing the impurity element which imparts n-type conductivity, and a portion of the amorphous semiconductor film are etched by dry etching. Note that wet etching and dry etching are used in the embodiment 1, but the operator may perform only dry etching by suitably selecting the reaction gas, and the operator may perform only wet etching by suitably selecting the reaction solution.

Further, the lower portion of the opening reaches the first amorphous semiconductor film, and the first amorphous semiconductor film is formed having a concave portion. The wiring is separated into the source wiring 621 and the pixel electrode 622 by the opening, and the second amorphous semiconductor film, containing an impurity element which imparts n-type conductivity is separated into the source region and the drain region.

If subsequent steps are performed in accordance with the embodiment 1 and fabrication is made, an active matrix substrate is obtained.

It is possible to freely combine the embodiment 6 with any one of the embodiments 1 to 9.

Embodiment 11

The present Embodiment shows an example of using a plastic substrate (or a plastic film) for the substrate. Note that since this Embodiment is almost identical to Embodiment 1 without the use of plastic substrate for the substrate, only different points are described.

PES (polyethylene sulfone), PC (polycarbonate), PET (polyethylene terephthalate) and PEN (polyethylene naphthalate) can be used as the plastic substrate material.

An active matrix substrate is completed using the plastic substrate provided that manufacturing is performed in accordance with Embodiment 1. Note that it is preferable to form the insulating film, the first amorphous semiconductor film, and the second amorphous semiconductor film containing an impurity element which imparts n-type conductivity by sputtering with the relatively low film deposition temperature.

A TFT having good characteristics can be formed on the plastic substrate, and the resulting display device can be made low weight. Further, it is possible to make a flexible electro-optical device because the substrate is plastic. Furthermore, assembly becomes easy.

Note that this Embodiment can be freely combined with any one of Embodiments 1 to 3, 9 and 10.

Embodiment 12

In the present embodiment, an example of forming a protecting circuit in a region other than a pixel portion in the same process in which second conductive films 123 and 124 covering the pixel electrode and source wiring can be formed is shown in FIG. 16.

In FIG. 16(A), reference numeral 701 denotes a wiring, and shows a gate wiring, a source wiring, or a common wiring extended from the pixel portion. Further, electrodes 701 are laid down in regions in which the wiring 701 is not formed, and are formed so as not to overlap the wiring 701. The present embodiment shows an example of forming the protecting circuit without increasing the number of masks, but there is no need to limit the structure to that of FIG. 16(A). For example, the number of masks may be increased and then, the protecting circuit may be formed by a protecting diode or a TFT.

Further, FIG. 16(B) shows an equivalent circuit diagram.

By making this type of constitution, the generation of static electricity due to friction between production devices and an insulating substrate can be prevented during the production process. In particular, the TFTs etc. can be protected from static electricity developing during a liquid crystal orienting process of rubbing performed during manufacture.

Note that the present embodiment can be freely combined with any one of the embodiments 1 to 11.

Embodiment 13

A bottom gate type TFT formed by implementing any one of the above embodiments 1 to 12 can be used in various electro-optical devices (such as an active matrix type liquid crystal display device). Namely, the present invention can be implemented in all electronic equipment in which these electro-optical devices are built into a display portion.

Figure 17:
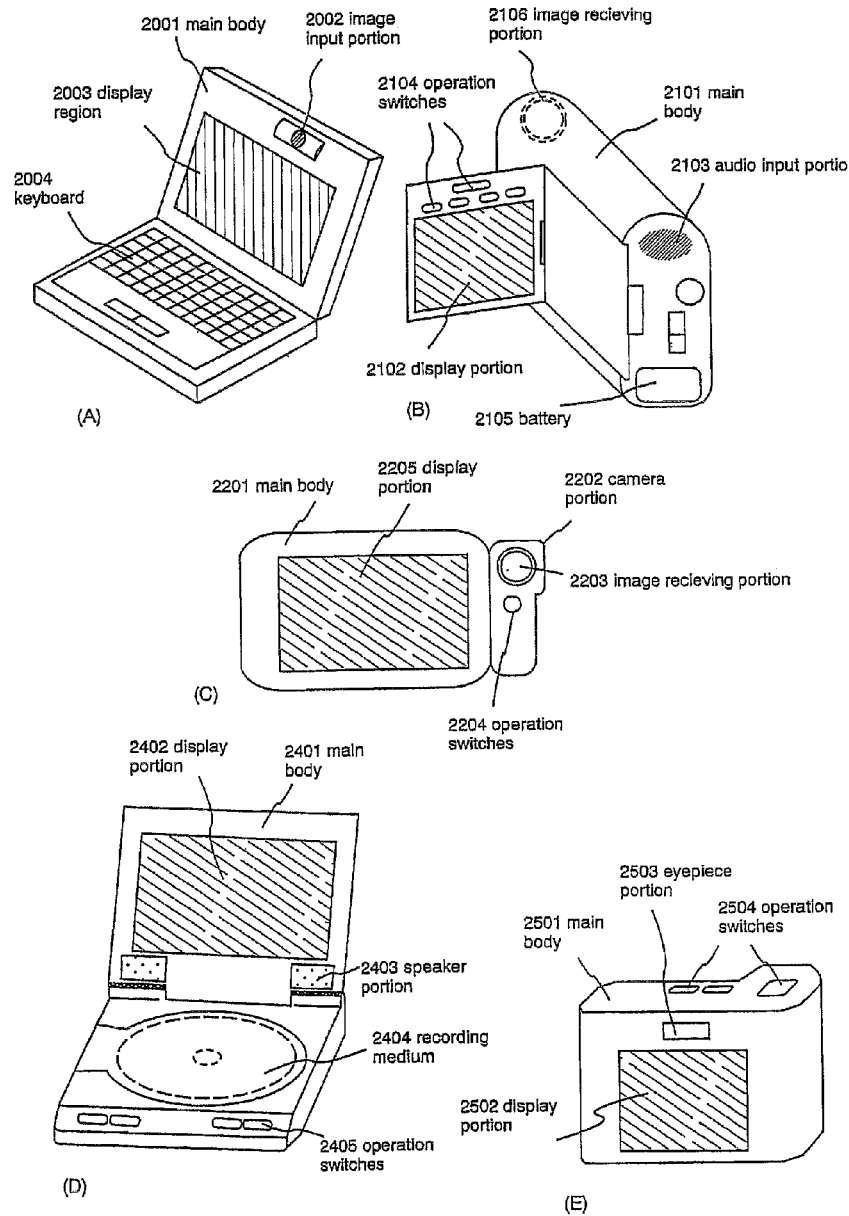
FIGS. 17A-E are diagrams showing examples of electronic equipment.
Figure 18:
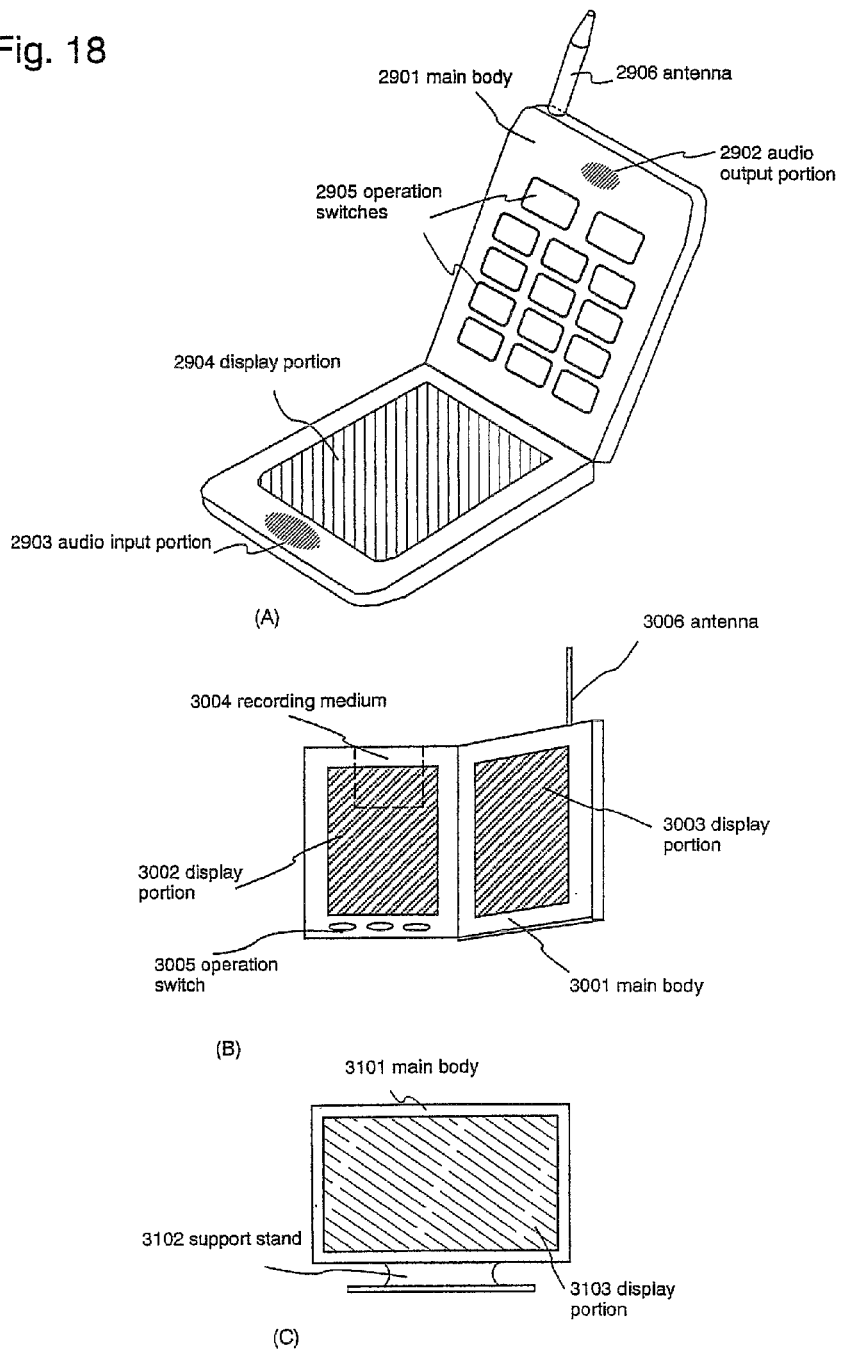
FIGS. 18A-C are diagrams showing examples of electronic equipment.

The following can be given as such electronic equipment: a video camera, a digital camera, a projector (rear type or front type), a head-mounted display (goggle type display), a car navigation system, a car stereo, a personal computer, and a portable information terminal (such as a mobile computer, a portable telephone or an electronic book). Examples of these are shown in FIGS. 17 and 18.

FIG. 17(A) is a personal computer, and it includes a main body 2001, an image input portion 2002, a display portion 2003, and a keyboard 2004. The present invention can be applied to the display portion 2003.

FIG. 17(B) is a video camera, and it includes a main body 2101, a display portion 2102, an audio input portion 2103, operation switches 2104, a battery 2105, and an image receiving portion 2106. The present invention can be applied to the display portion 2102.

FIG. 17(C) is a mobile computer, and it includes a main body 2201, a camera portion 2202, an image receiving portion 2203, operation switches 2204, and a display portion 2205. The present invention can be applied to the display portion 2205.

FIG. 17(D) is a player that uses a recording medium on which a program is recorded (hereafter referred to as a recording medium), and the player includes a main body 2401, a display portion 2402, a speaker portion 2403, a recording medium 2404, and operation switches 2405. Note that this player uses a recording medium such as a DVD (digital versatile disk) or a CD, and the appreciation of music, the appreciation of film, game playing and the Internet can be performed. The present invention can be applied to the display portion 2402.

FIG. 17(E) is a digital camera, and it includes a main body 2501, a display portion 2502, an eyepiece portion 2503, operation switches 2504, and an image receiving portion (not shown in the figure). The present invention can be applied to the display portion 2502.

FIG. 18(A) is a portable telephone, and it includes a main body 2901, an audio output portion 2902, an audio input portion 2903, a display portion 2904, operation switches 2905, and an antenna 2906. The present invention can be applied to the display portion 2904.

FIG. 18(B) is a portable book (electronic book), and it includes a main body 3001, display portions 3002 and 3003, a recording medium 3004, operation switches 3005, and an antenna 3006. The present invention can be applied to the display portions 3002 and 3003.

FIG. 18(C) is a display, and it includes a main body 3101, a support stand 3102, and a display portion 3103. The present invention can be applied to the display portion 3103. The display of the present invention is advantageous for a large size screen in particular, and is advantageous for a display equal to or greater than 10 inches (especially equal to or greater than 30 inches) in the opposite angle.

The applicable range of the present invention is thus extremely wide, and it is possible to apply the present invention to electronic equipment in all fields. Further, the electronic equipment of the embodiment 13 can be realized by using a constitution of any combination of the embodiments 1 to 12.

What is claimed is:

1. A liquid crystal display device comprising:
a gate wiring over an insulating surface;
a common wiring over the insulating surface;
a first insulating film comprising silicon nitride over the gate wiring and the common wiring;
a first amorphous semiconductor film over the first insulating film;
a pair of second amorphous semiconductor films over the first amorphous semiconductor film;
a source wiring over one of the pair of second amorphous semiconductor films;
a second insulating film comprising silicon nitride over the source wiring;
a common electrode electrically connected to the common wiring;
a transparent electrode electrically connected to the other of the pair of second amorphous semiconductor films;
an alignment film over the transparent electrode and the common electrode; and
a liquid crystal over the alignment film,
wherein the source wiring overlaps the first amorphous semiconductor film and one of the pair of second amorphous semiconductor films,
wherein the first amorphous semiconductor film and one of the pair of second amorphous semiconductor films extend along the source wiring,
wherein the second insulating film is in contact with the first amorphous semiconductor film and the pair of second amorphous semiconductor films in a region overlapping the gate wiring,
wherein the transparent electrode overlaps the common wiring, and
wherein the source wiring overlaps the gate wiring and the common wiring.

2. The liquid crystal display device according to claim 1, wherein the common electrode is formed in a same layer as the common wiring.

3. The liquid crystal display device according to claim 1, wherein the gate wiring and the common wiring are formed by patterning a conductive layer.

4. The liquid crystal display device according to claim 1, wherein the gate wiring comprises an element selected from the group consisting of Al, Cu, Ti, Mo, W, Ta, Nd, and Cr, and an alloy of the elements.

5. The liquid crystal display device according to claim 1, wherein the transparent electrode and the common electrode are disposed so that an orientation of the liquid crystal is controlled by an electric field produced between the transparent electrode and the common electrode.

6. A liquid crystal display device comprising:
a gate wiring over an insulating surface;
a common wiring over the insulating surface;
a first insulating film comprising silicon nitride over the gate wiring and the common wiring;
a first amorphous semiconductor film over the first insulating film;

a pair of second amorphous semiconductor films over the first amorphous semiconductor film;

a source wiring over one of the pair of second amorphous semiconductor films;

a second insulating film comprising silicon nitride over the source wiring;

a common electrode electrically connected to the common wiring;

a transparent electrode electrically connected to the other of the pair of second amorphous semiconductor films;

an alignment film over the transparent electrode and the common electrode;

a liquid crystal over the alignment film; and a terminal portion comprising a conductive layer formed of a same layer as the transparent electrode, wherein the source wiring overlaps the first amorphous semiconductor film and one of the pair of second amorphous semiconductor films, wherein the first amorphous semiconductor film and one of the pair of second amorphous semiconductor films extend along the source wiring, wherein the second insulating film is in contact with the first amorphous semiconductor film and the pair of second amorphous semiconductor films in a region overlapping the gate wiring, wherein the transparent electrode overlaps the common wiring, and wherein the source wiring overlaps the gate wiring and the common wiring.

7. The liquid crystal display device according to claim 6, wherein the common electrode is formed in a same layer as the common wiring.

8. The liquid crystal display device according to claim 6, wherein the gate wiring and the common wiring are formed by patterning a second conductive layer.

9. The liquid crystal display device according to claim 6, wherein the gate wiring comprises an element selected from the group consisting of Al, Cu, Ti, Mo, W, Ta, Nd, and Cr, and an alloy of the elements.

10. The liquid crystal display device according to claim 6, wherein the transparent electrode and the common electrode are disposed so that an orientation of the liquid crystal is controlled by an electric field produced between the transparent electrode and the common electrode.

11. A liquid crystal display device comprising:
a gate wiring over an insulating surface;
a common wiring over the insulating surface;
a first insulating film over the gate wiring and the common wiring;
a first amorphous semiconductor film over the first insulating film;
a pair of second amorphous semiconductor films over the first amorphous semiconductor film;
a source wiring over one of the pair of second amorphous semiconductor films;
a second insulating film over the source wiring;
a common electrode electrically connected to the common wiring;
a transparent electrode electrically connected to the other of the pair of second amorphous semiconductor films;
an alignment film over the transparent electrode and the common electrode;
a liquid crystal over the alignment film; and
a terminal portion comprising a conductive layer formed of a same layer as the transparent electrode, wherein the source wiring overlaps the first amorphous semiconductor film and one of the pair of second amorphous semiconductor films, wherein the first amorphous semiconductor film and one of the pair of second amorphous semiconductor films extend along the source wiring, wherein the second insulating film is in contact with the first amorphous semiconductor film and the pair of second amorphous semiconductor films in a region overlapping the gate wiring, wherein the transparent electrode overlaps the common wiring, and wherein the source wiring overlaps the gate wiring and the common wiring.

12. The liquid crystal display device according to claim 11, wherein the common electrode is formed in a same layer as the common wiring.

13. The liquid crystal display device according to claim 11, wherein the gate wiring and the common wiring are formed by patterning a second conductive layer.

14. The liquid crystal display device according to claim 11, wherein the gate wiring comprises an element selected from the group consisting of Al, Cu, Ti, Mo, W, Ta, Nd, and Cr, and an alloy of the elements.

15. The liquid crystal display device according to claim 11, wherein the transparent electrode and the common electrode are disposed so that an orientation of the liquid crystal is controlled by an electric field produced between the transparent electrode and the common electrode.

* * * * *

UNITED STATES PATENT AND TRADEMARK OFFICE
CERTIFICATE OF CORRECTION

PATENT NO.         : 8,873,011 B2                                   Page 1 of 1
APPLICATION NO.    : 14/104284
DATED              : October 28, 2014
INVENTOR(S)        : Shunpei Yamazaki et al.

It is certified that error appears in the above-identified patent and that said Letters Patent is hereby corrected as shown below:

In the Specification,

At column 9, line 55, "(pc-Si:H)." should be --(μc-Si:H).--;

At column 16, line 3, "(pc-Si:H)" should be --(μc-Si:H)--.

Signed and Sealed this
Thirty-first Day of March, 2015

Michelle K. Lee
*Director of the United States Patent and Trademark Office*